US012197783B2

(12) United States Patent
Hsu et al.

(10) Patent No.: US 12,197,783 B2
(45) Date of Patent: Jan. 14, 2025

(54) COMMAND AND ADDRESS SEQUENCING IN PARALLEL WITH DATA OPERATIONS

(71) Applicant: SanDisk Technologies LLC, Addison, TX (US)

(72) Inventors: Hua-Ling Cynthia Hsu, Fremont, CA (US); Fanglin Zhang, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 198 days.

(21) Appl. No.: 17/732,260

(22) Filed: Apr. 28, 2022

(65) Prior Publication Data

US 2023/0350606 A1 Nov. 2, 2023

(51) Int. Cl.
*G06F 3/06* (2006.01)
*G06F 13/16* (2006.01)

(52) U.S. Cl.
CPC ............ *G06F 3/0659* (2013.01); *G06F 3/061* (2013.01); *G06F 3/0679* (2013.01); *G06F 13/1668* (2013.01)

(58) Field of Classification Search
CPC ...... G06F 3/061; G06F 3/0659; G06F 3/0679; G06F 13/1668; G11C 16/0483; G11C 29/14
See application file for complete search history.

(56) References Cited

U.S. PATENT DOCUMENTS

| 5,420,984 A | * | 5/1995 | Good | G06F 13/287 709/212 |
| 2003/0014688 A1 | * | 1/2003 | Wu | G11C 29/886 714/6.32 |
| 2017/0249276 A1 | * | 8/2017 | Kim | G06F 13/1668 |

* cited by examiner

*Primary Examiner* — Larry T Mackall
(74) *Attorney, Agent, or Firm* — Sheppard, Mullin, Richter & Hampton LLP

(57) ABSTRACT

A command/address sequence associated with a read/write operation for a memory device that utilizes an existing test data bus in a novel way that obviates the need to utilize an I/O bus for the command/address sequence. As such, the command/address sequence can be performed in parallel with the read/write operations, thereby removing a performance bottleneck that would otherwise be caused by the command and address sequencing. The command/address sequence detects a first enable signal and a data signal on the test data bus and decodes the data signal to obtain at least one of a command latch enable signal and address latch enable signal and at least one of a command code and an address code.

20 Claims, 22 Drawing Sheets

COMMAND AND ADDRESS SEQUENCING IN PARALLEL WITH DATA OPERATIONS

BACKGROUND

Flash memory is an electronic, non-volatile computer memory storage medium that can be electrically erased and reprogrammed. Flash memory is now widely used across a range of products and industries including computers, smartphones, tablets, digital audio players, digital cameras, wearable devices, video games, scientific instrumentation, industrial robotics, medical electronics, and so forth. NAND flash memory—one of the two primary types of flash memory—has become the preferred choice of flash memory for memory cards, USB flash drives, solid-state drives, and the like. NAND flash may connect floating gate transistors (e.g., floating gate metal-oxide-semiconductor field-effect transistors (MOSFETs)) or transistors that include a charge trapping layer (CTL) in a manner that resembles a NAND logic gate to form memory cells that can be programmed to store bit information. In particular, the bit information is stored as the threshold voltages of the transistors of the cells. Various types of NAND flash technology exist and differ with respect to the number of programmable states they support, and thus, the number of bits of information that an individual memory cell can store.

In connection with an operation to write data to a NAND device or an operation to read data there from, a controller may perform a command and address sequence to inform the NAND device of the type of operation to be performed (e.g., read or write operation) prior to the data actually being written to or read from the NAND. The time to perform the command and address sequence can be a limiting factor to overall NAND performance.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
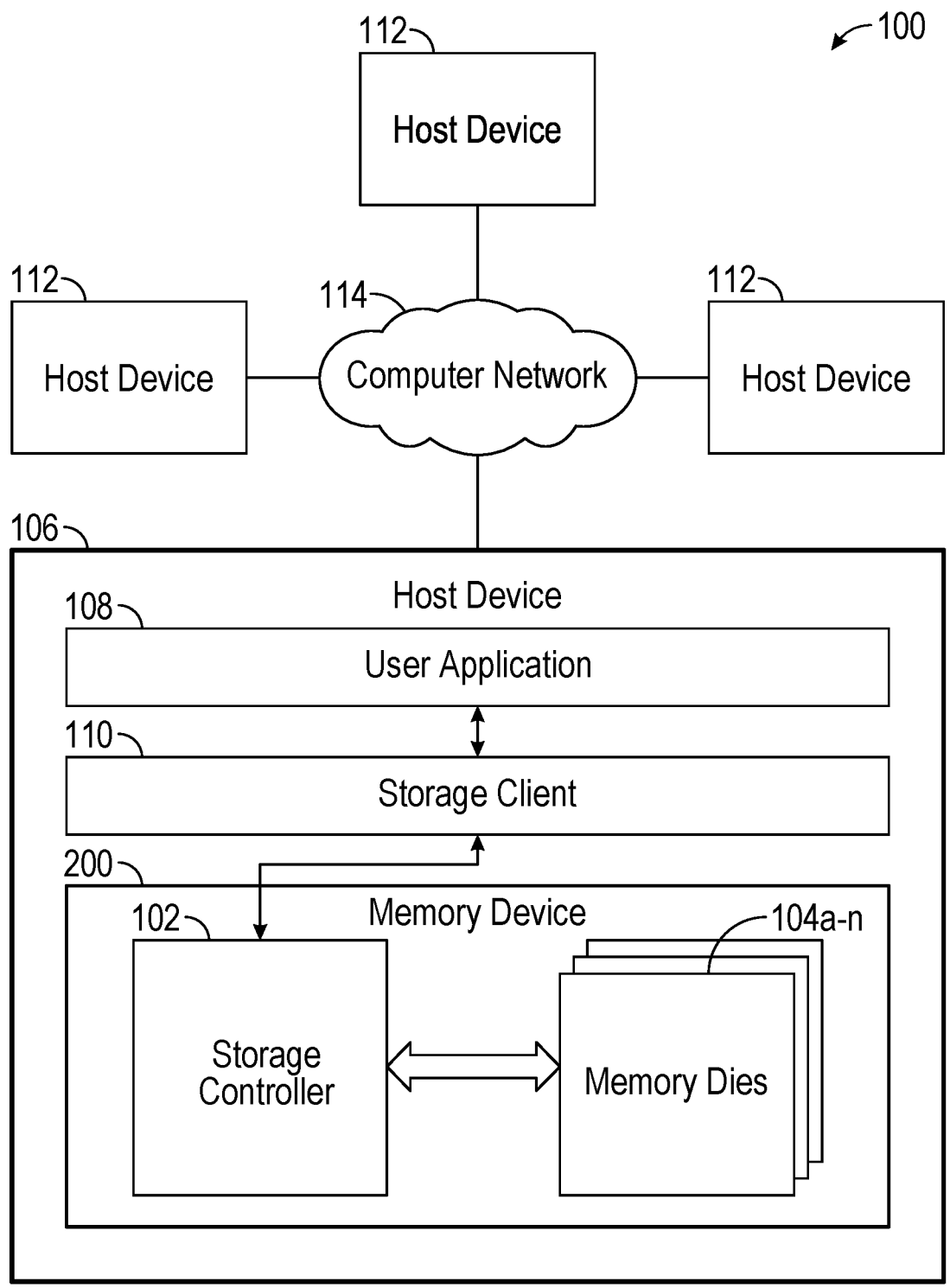
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

Data IN (DIN) and data OUT (DOUT) speeds for write and read operations for memory devices (e.g., a NAND flash device) continue to increase. Similar performance gains, however, have not been achievable with respect to command and addressing sequencing. As such, the command and addressing sequencing time remains a bottleneck for overall system timing. While the command/addressing speed can be increased to some degree, the extent of the increase that can be achieved is limited. Moreover, this approach is not scalable.

Embodiments of the disclosed technology relate to systems, devices, circuits, methods, computer-readable media, and techniques for performing a command/address sequence associated with a data operation (such as a read operation, write operation, erase operation, etc.) for a memory device that does not require an input/output (I/O) bus, and thus, can be performed in the background and in parallel with DIN/DOUT operations. According to example embodiments of the disclosed technology, the command/address sequence utilizes an existing interface, previously used only for testing of the memory system during manufacturing and prior to shipping to consumers, in a novel way that obviates the need to utilize the I/O bus. Traditionally, the test interface was not utilized for consumer or user DIN/DOUT operations or command/address sequencing. Instead, the test interface, which is include in memory devices (e.g., a NAND flash device), was left unconnected and unused after manufacturing and chip verification. As such, a command/address sequence according to embodiments of the disclosed technology can be performed in parallel with the DIN/DOUT operations, thereby removing the performance bottleneck that would otherwise be caused by the command and address sequencing and providing a technical solution to a technical problem associated with existing command and address sequencing.

In an example embodiment of the disclosed technology, a controller generates a first enable signal for triggering command and address sequencing techniques and generates a first data signal encoded with a second enable signal followed data that includes a command code or an address code. The generated signals are provided to a memory array over a I/O data bus of a second memory interface, where the I/O data bus of the second memory interface is a separate an I/O data bus of a first memory interface used for DIN/DOUT operations. The second enable signal notifies the memory array that the data encoded in the first data signal is a command code or an address code. For instance, the second enable signal may be a command latch enable (CLE) signal or an address latch enable (ALE) signal. In example embodiments, the second interface is a test interface, conventionally used only for testing memory array chip performance during manufacture and before shipment for sale to consumers. Thus, the test interface (e.g., an X1 interface or by 1 interface) uses an I/O data bus comprising a 1- or 2-bit I/O signal lines, whereas the I/O data bus of the first memory interface used for DIN/DOUT operations uses 8-bit I/O signal lines. Embodiments herein are not limited to 1- or 2-bit I/O signal lines, but may include an I/O data bus having fewer I/O signal lines than the I/O data bus used for the DIN/DOUT operations. While the signal lines and associated pins have been generally used only for testing prior to public sale, memory devices are shipped with the test interface and electrical connections (e.g., pins) present within the devices but unused for consumer data.

However, in contrast to these existing memory device, as introduced above, the embodiments herein leverage the existing test interface and electrical connections for command and address sequencing as outlined above. Embodiments herein provide commands and address sequencing for read/write operations using the I/O data bus (referred to herein as a test data bus) of the second memory interface, separate from the data bus used for a DIN/DOUT operation for read/write operations. Using separate bus and data signal frees up the I/O data bus of the first memory interface for additional DIN/DOUT operations. Thus, command/address sequencing can be performed in the background, parallel, and simultaneously with DIN/DOUT operations, which reduces overall data processing overhead by hiding command/address sequencing processing overhead in the background.

Accordingly, embodiments herein provide a technical solution to a technical problem associated with existing command and address sequencing by performing command/address sequence in parallel with DIN/DOUT operations, thereby reducing (and even removing) performance bottleneck due to process time overhead. Thus, read/write operation performance can be improved by hiding (e.g., executing in the background) command/address overhead, which enables embodiments disclosed herein to be constrained more by DIN/DOUT operation speeds and less so by command/address sequencing processing.

FIGS. 1 to 4G depict an example memory system that can be used to implement the technology disclosed herein. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB")

connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, WiFi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
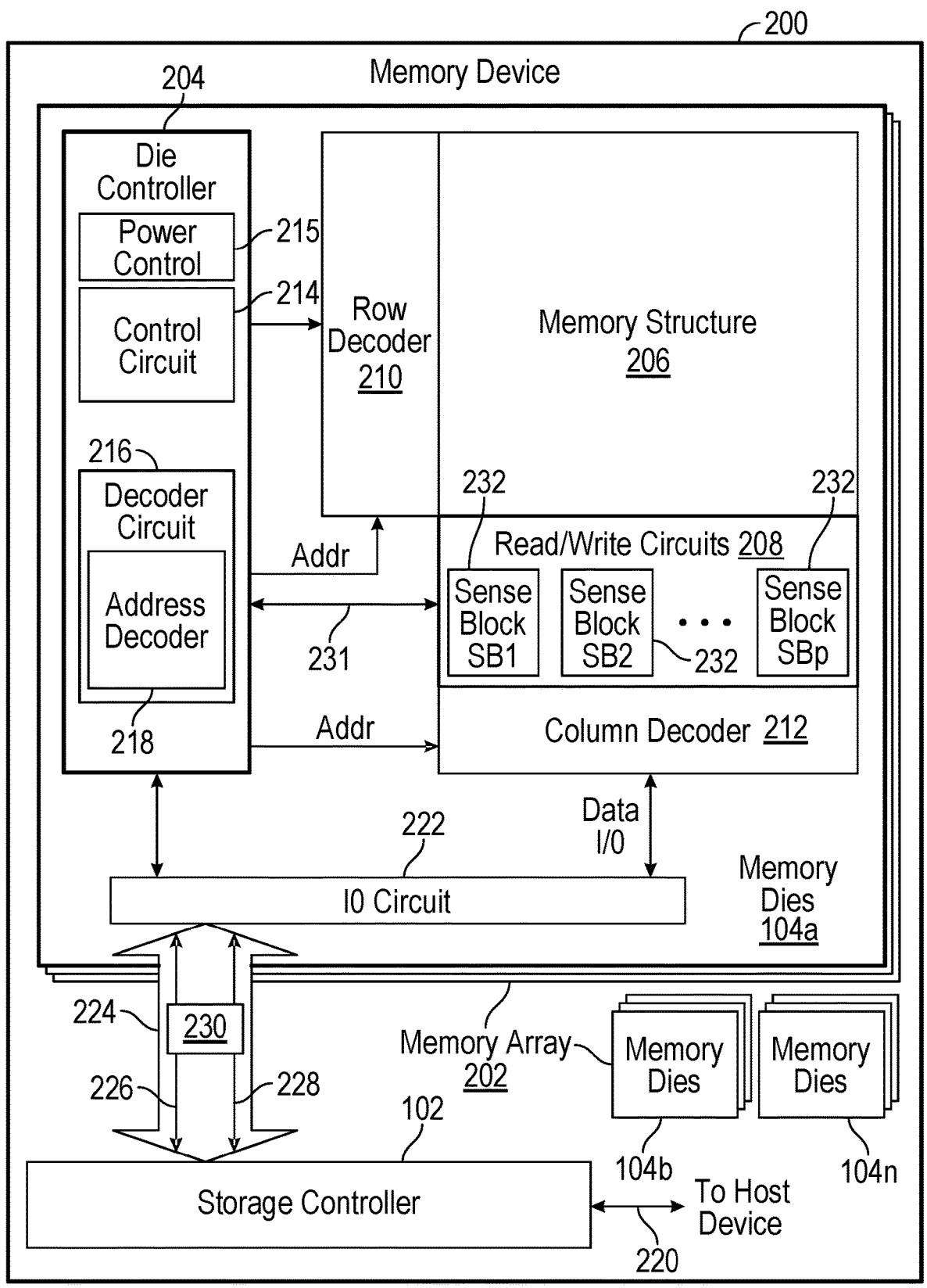
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104a-n, the storage controller 102 and memory dies 104a-n being effectively as described with regard to FIG. 1. Each memory die 104a-n can be a complete memory die or a partial memory die and may include a die controller 204, at least one memory structure 206, and read/write circuits 208. The following description will be made with reference to memory die 104a as an example of memory dies 104a-n, where each memory die may include same or similar components and function in the same or similar way. Thus, while reference herein is made to memory die 104a, the same description may be applied equally to memory dies 104b-n.

In this context, "memory array" refers to a set of memory cells (also referred to as storage cells) organized into an array structure having rows and columns. A memory array is addressable using a row identifier and a column identifier, each represented as part of an address, such as a command address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D—laid out in a single fabrication plane) or three-dimensional (3D—laid out in multiple fabrication planes). The non-volatile memory array 206 may comprise one or more arrays of memory cells including a 3D array. In one embodiment, the non-volatile memory array 206 may comprise a monolithic three-dimensional memory structure (3D array) in which multiple memory levels are formed above (and not in) a single substrate, such as a wafer, with no intervening substrates. The non-volatile memory array 206 may comprise any type of non-volatile memory that is monolithically formed in one or more physical levels of arrays of memory cells having an active area disposed above a silicon substrate. The non-volatile memory array 206 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 206 and includes a control circuit 214 (also referred to as a state machine) and a decoder circuit 216 that may incorporate an address decoder 218. The control circuit 214 provides chip-level control of memory operations on the memory die 104a. The die controller 204 may also include power control circuit 215 that controls the power and voltages supplied to the wordlines, bitlines, and select lines during memory operations. The power control circuit 204 may include voltage circuitry, in one embodiment. Power control circuit 204 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DOS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WE"), chip enable ("CEn"), read enable ("RE"), a clock signal, strobe signal ("DOS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (IO) circuit 222 may be coupled, through the memory interface 224 and to the memory interface circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via memory interface circuit 234.

In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 206 and the control circuit 214 in order to transfer data between the non-volatile memory array 206 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
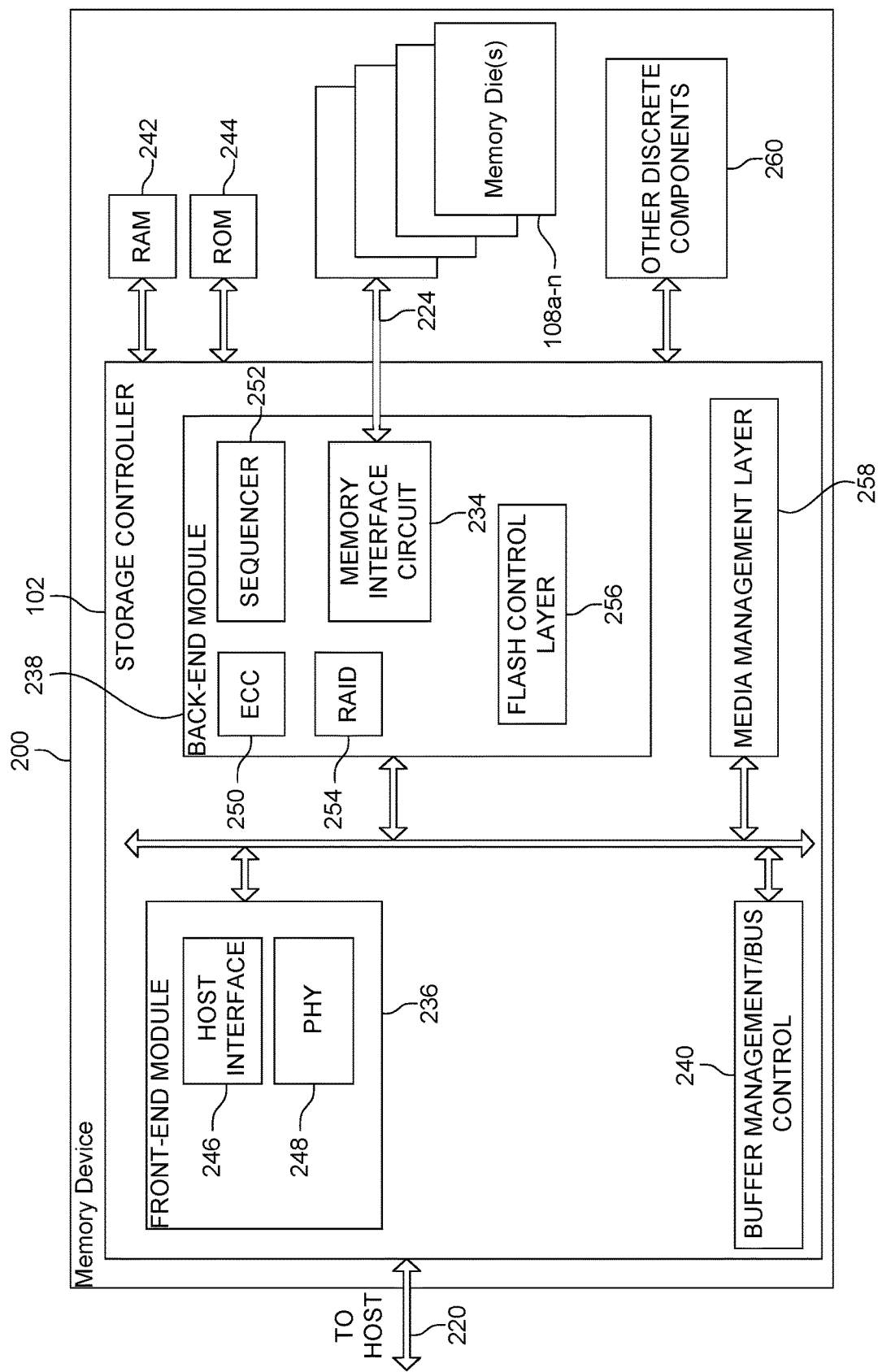
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory die 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the memory interface circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 205 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 3:
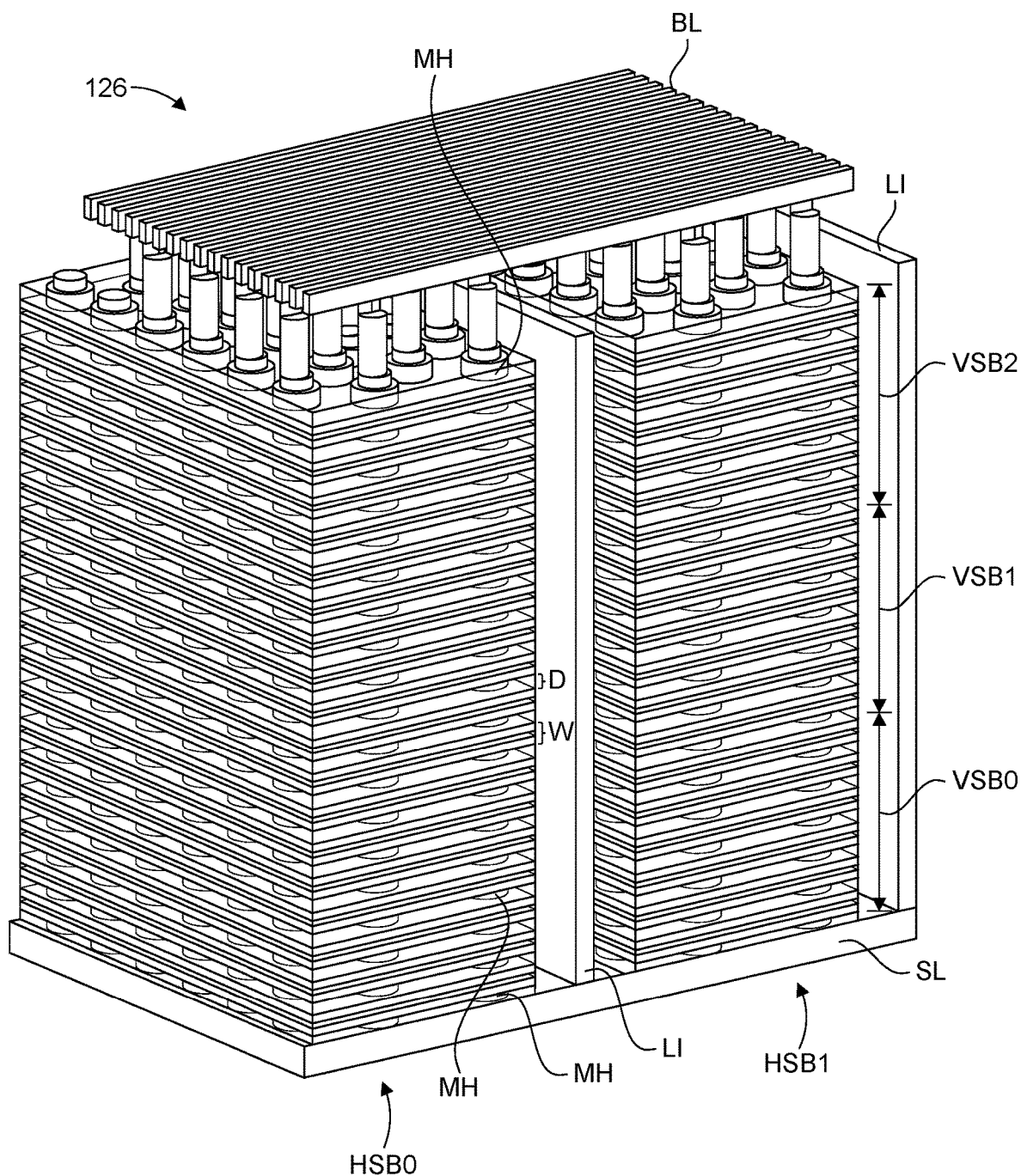
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
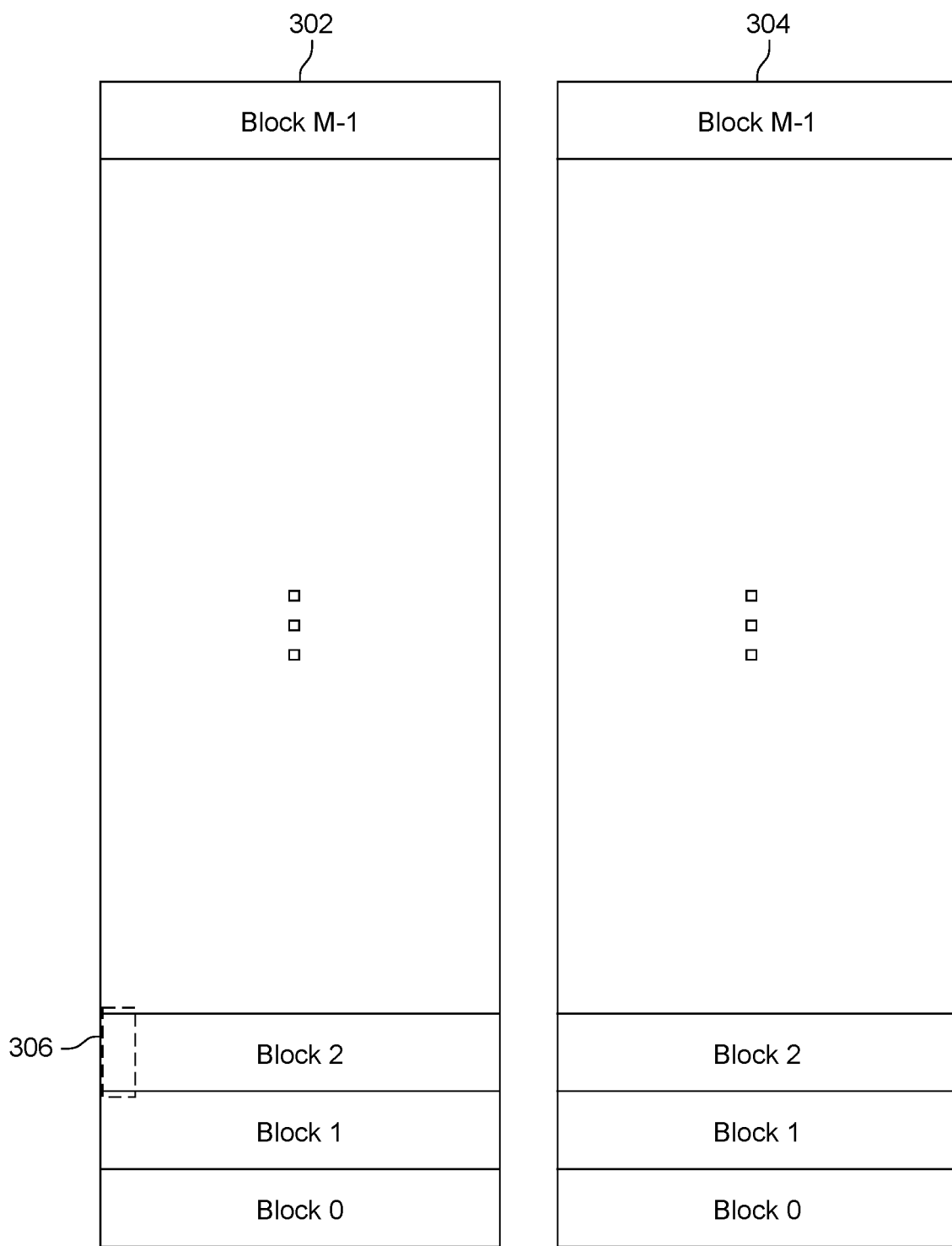
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

Figure 4B:
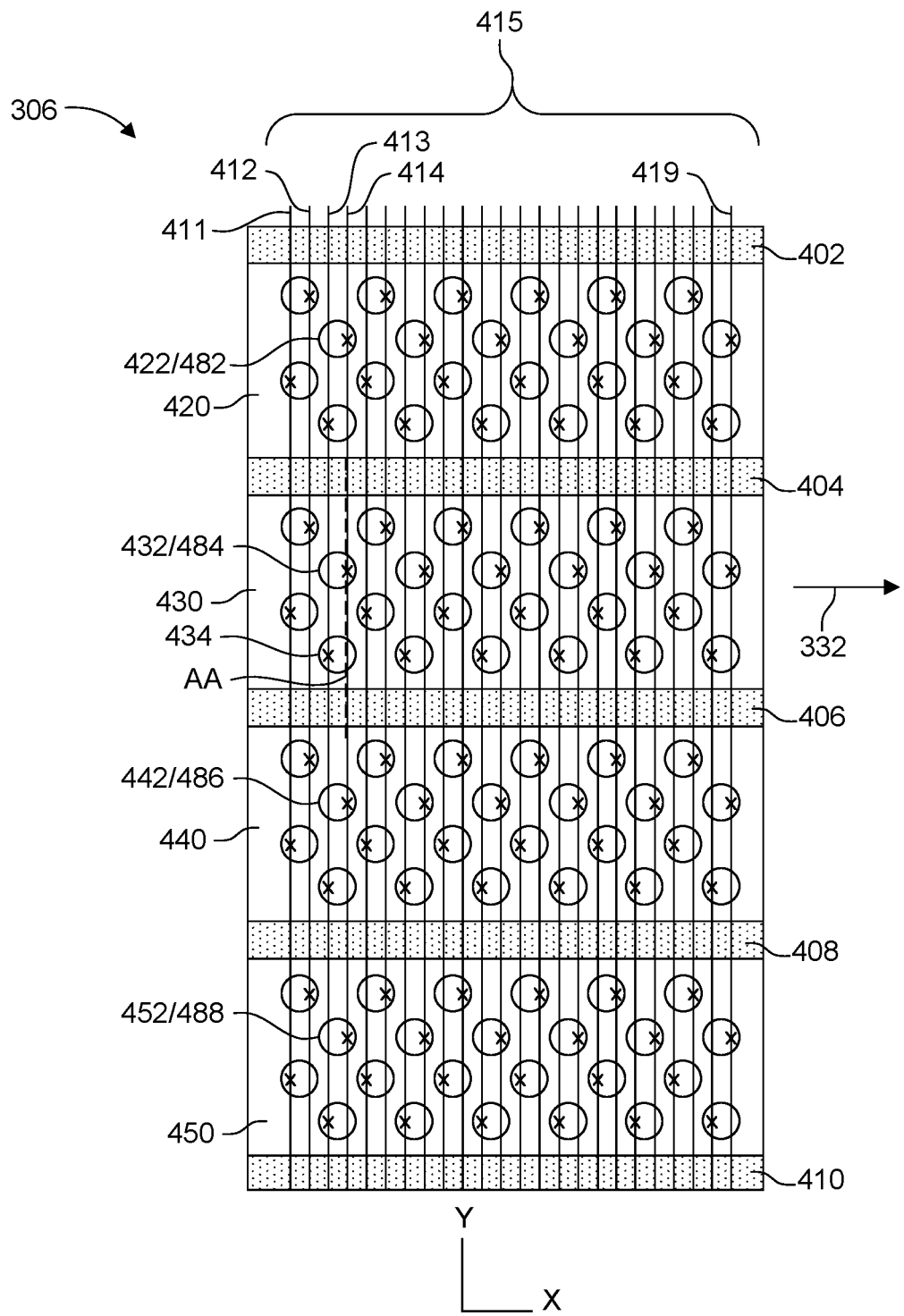
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
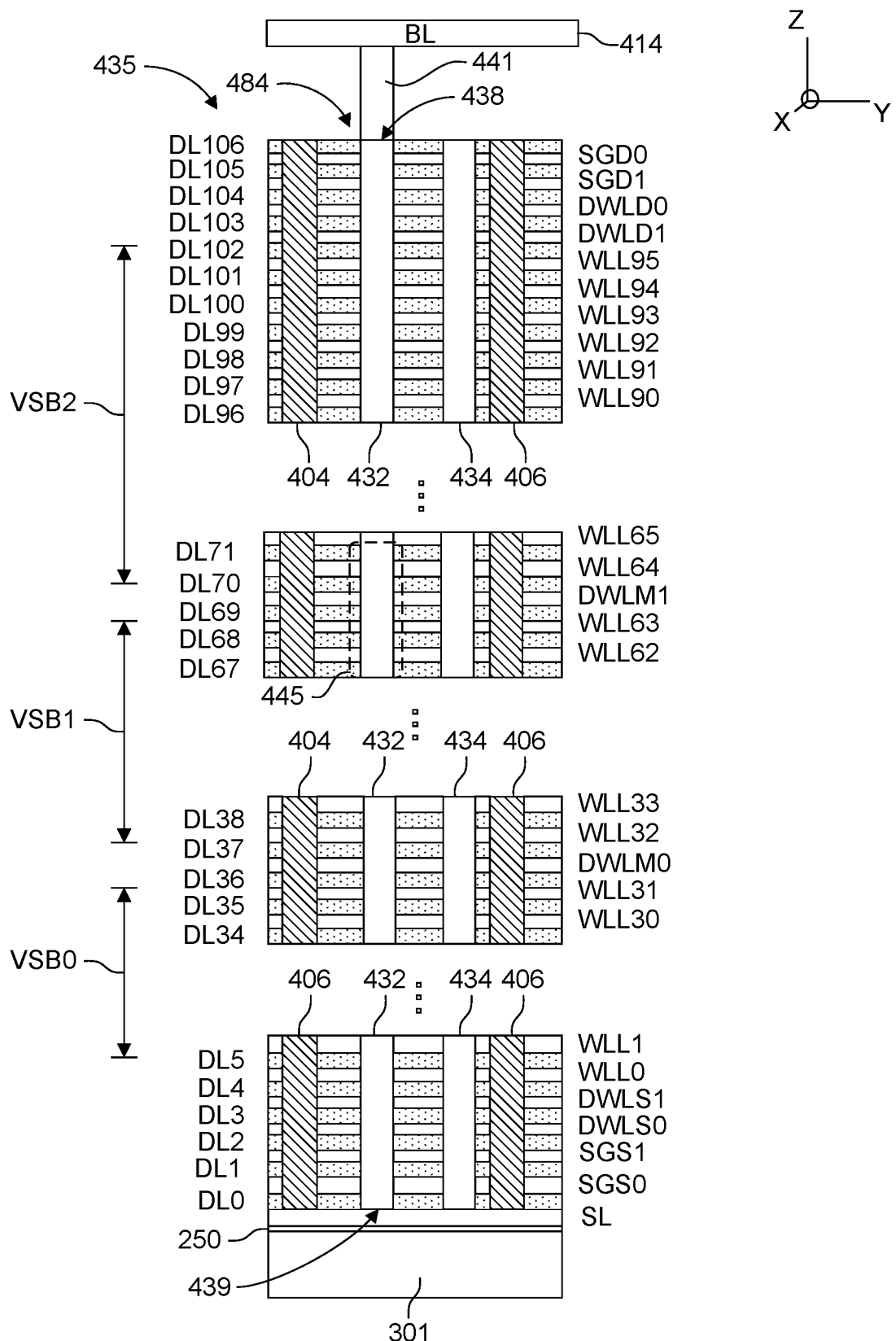
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
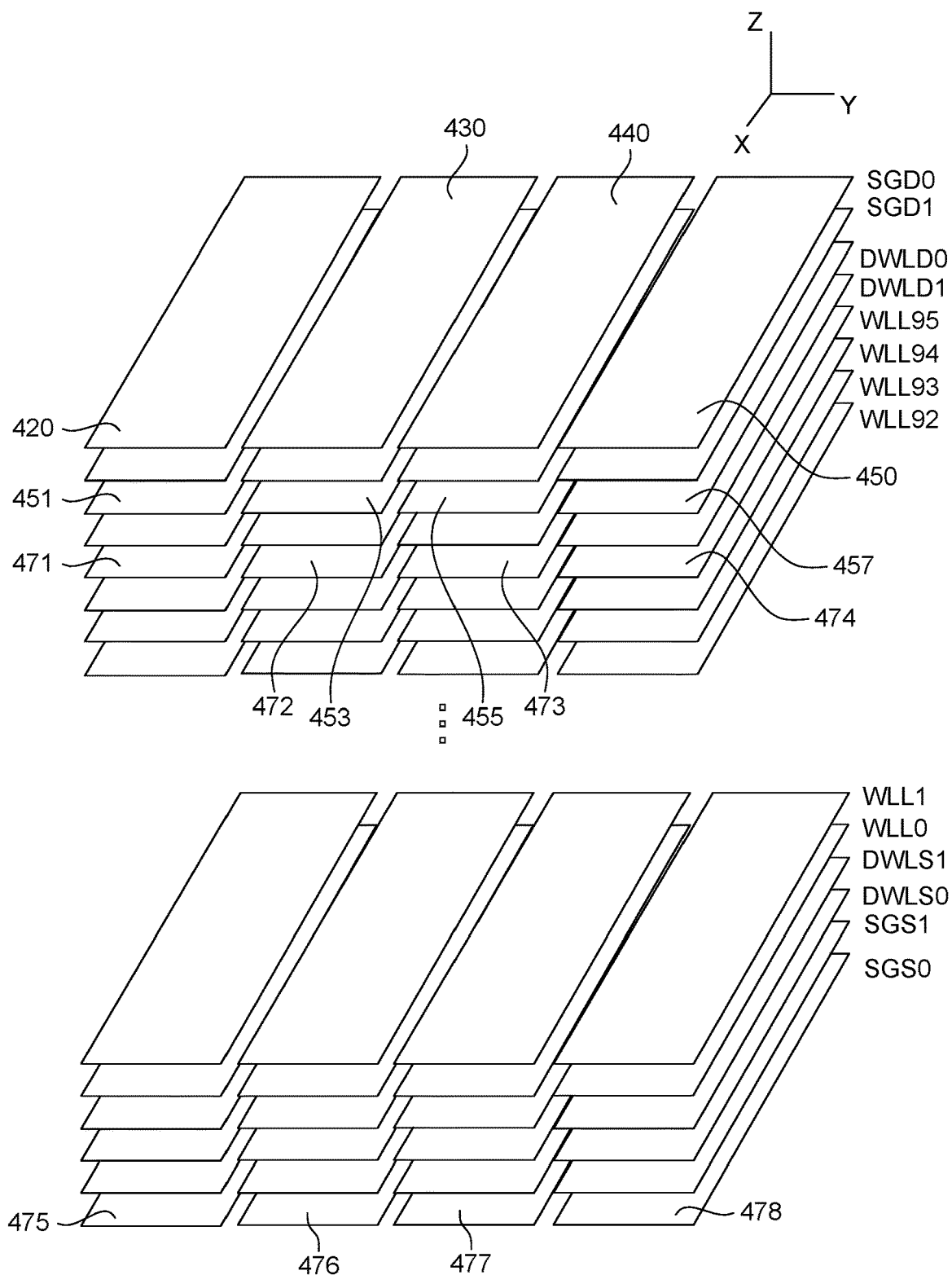
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
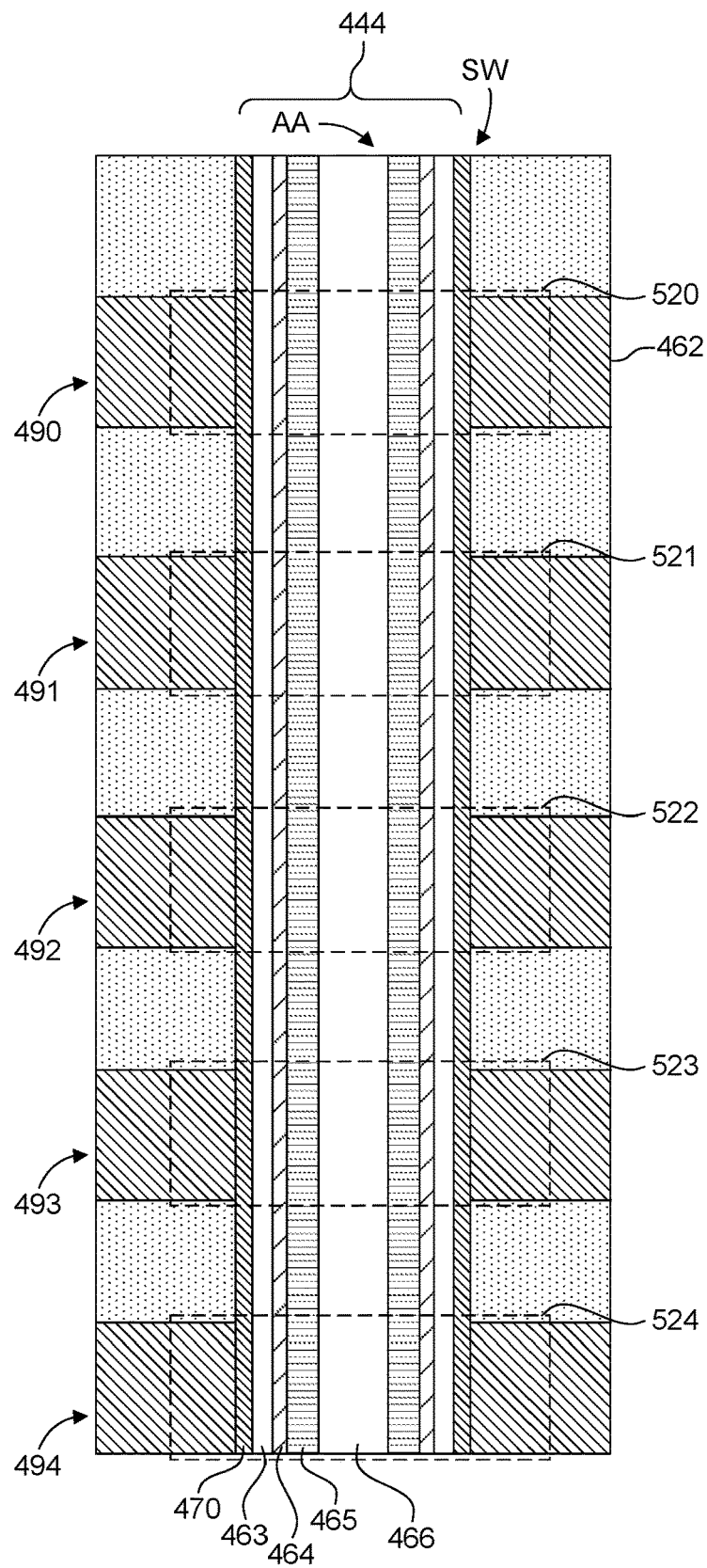
FIG. 4E depicts a view of a region of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
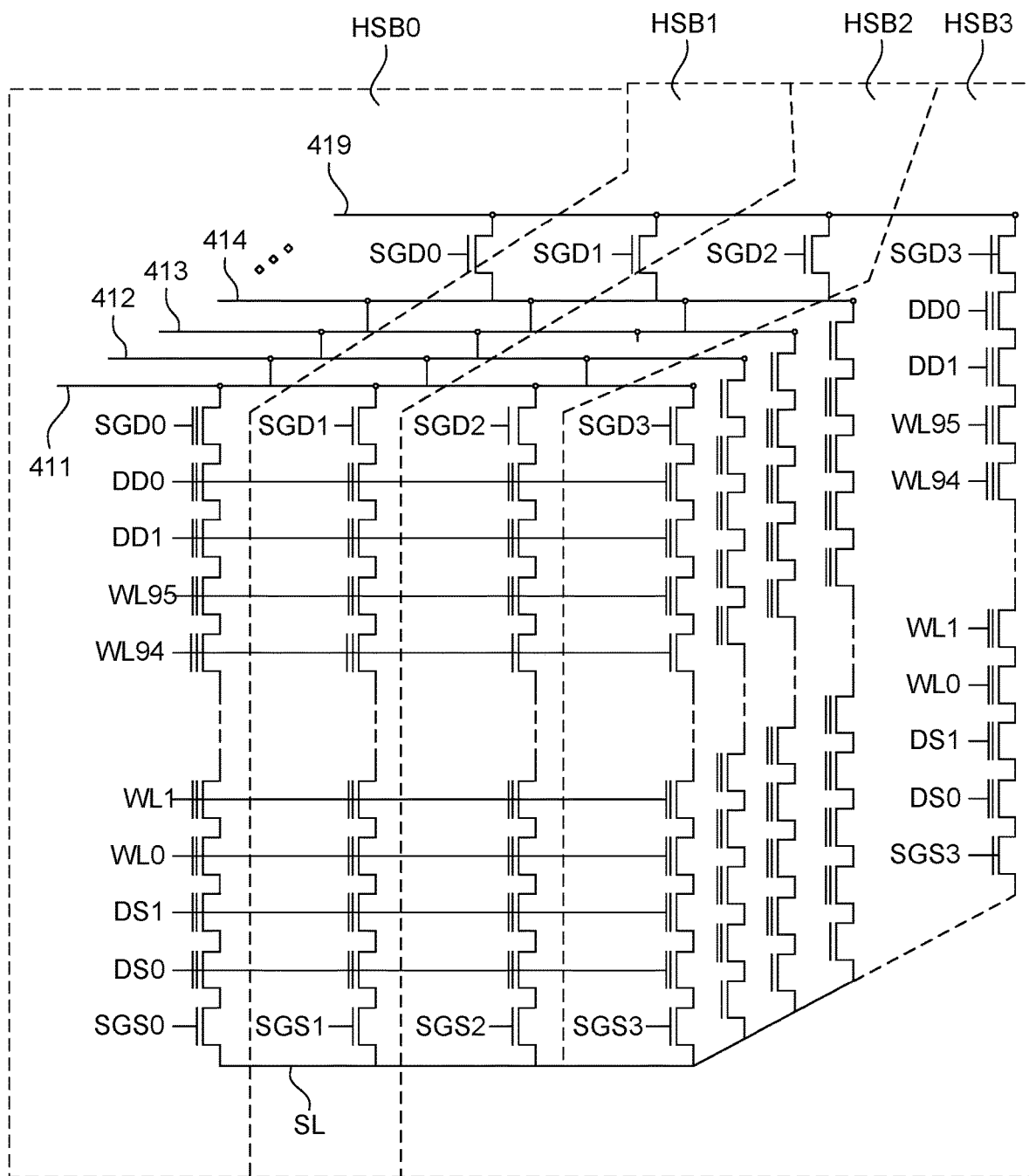
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
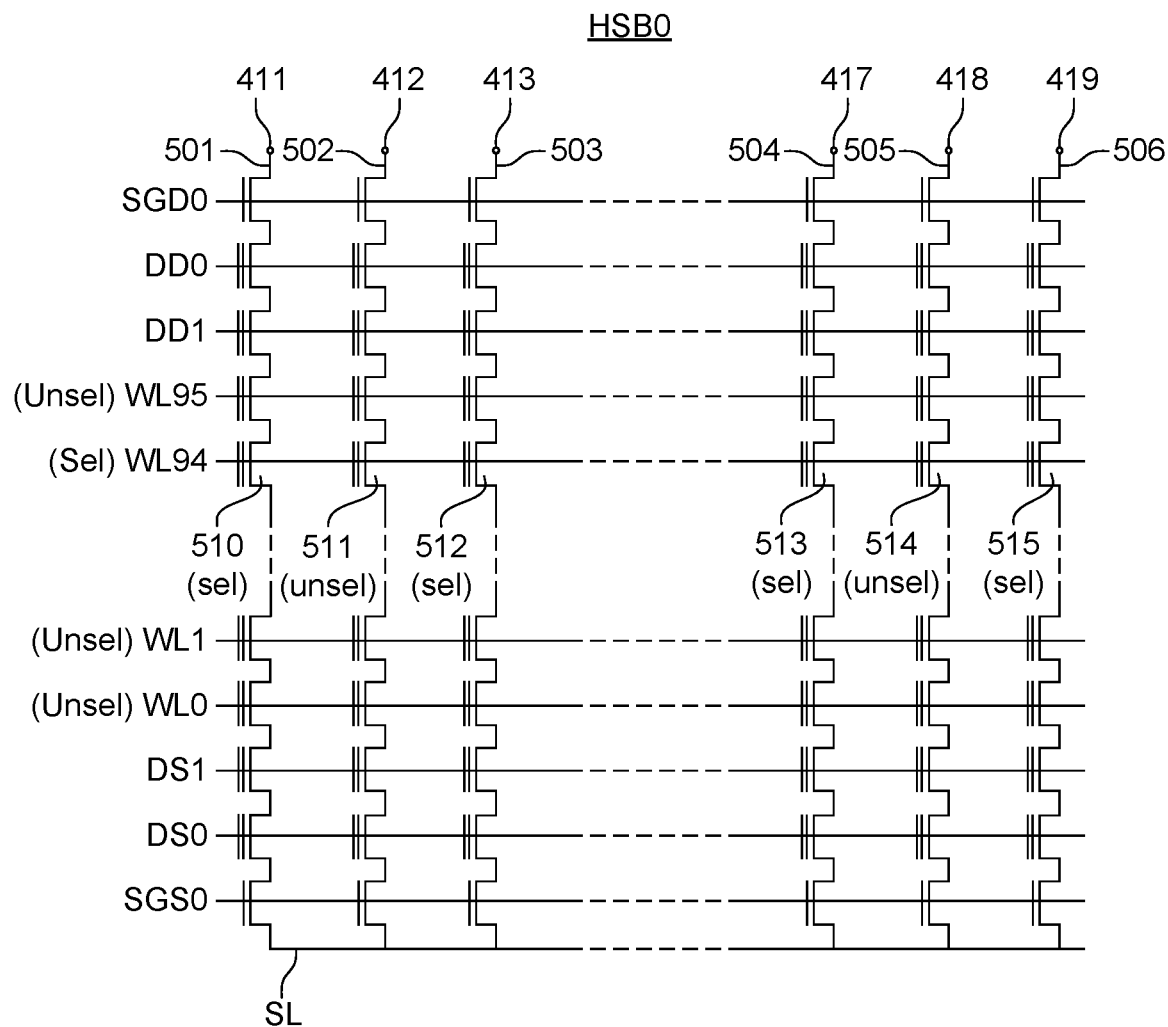
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
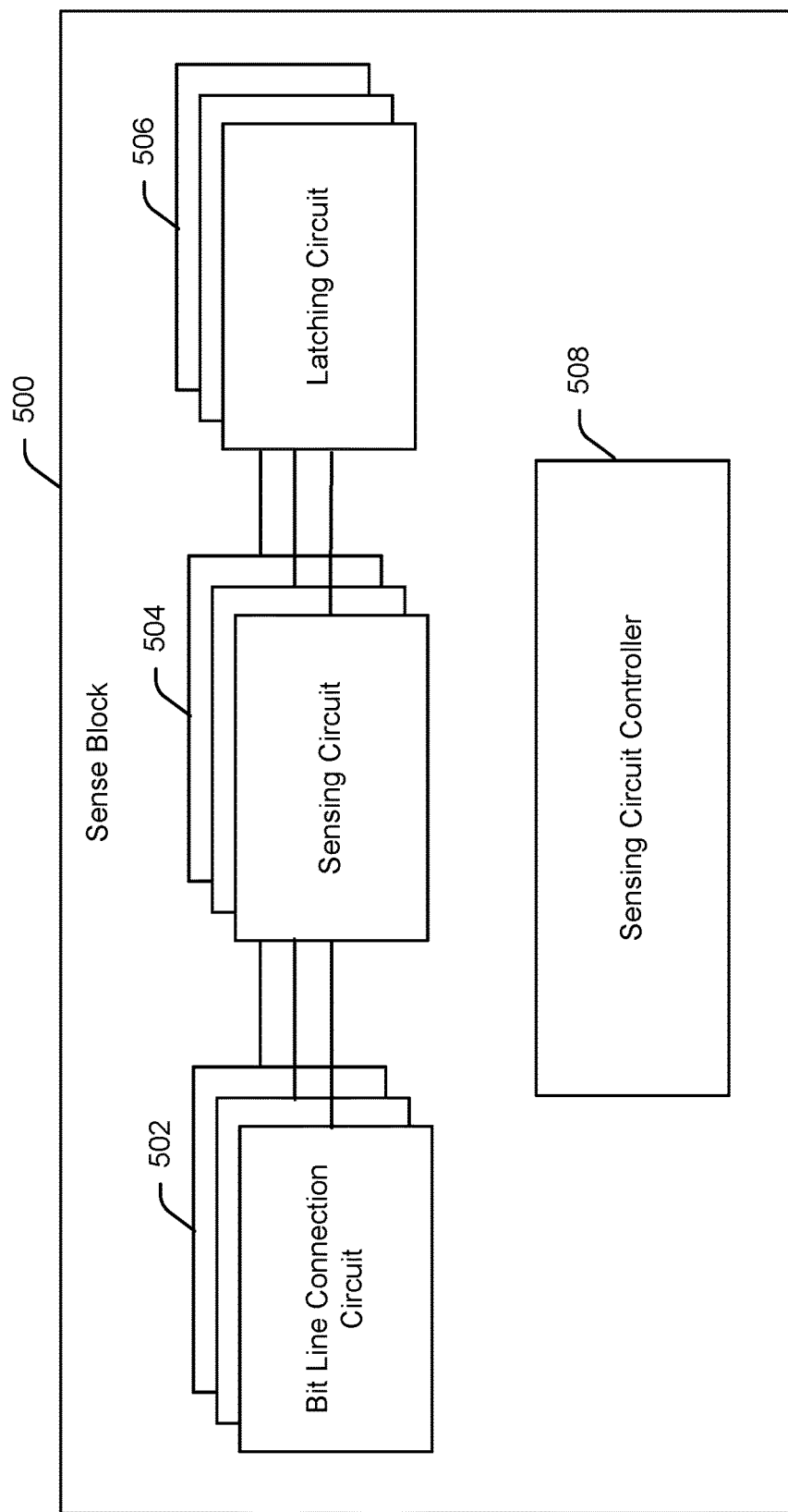
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 232 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g., for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
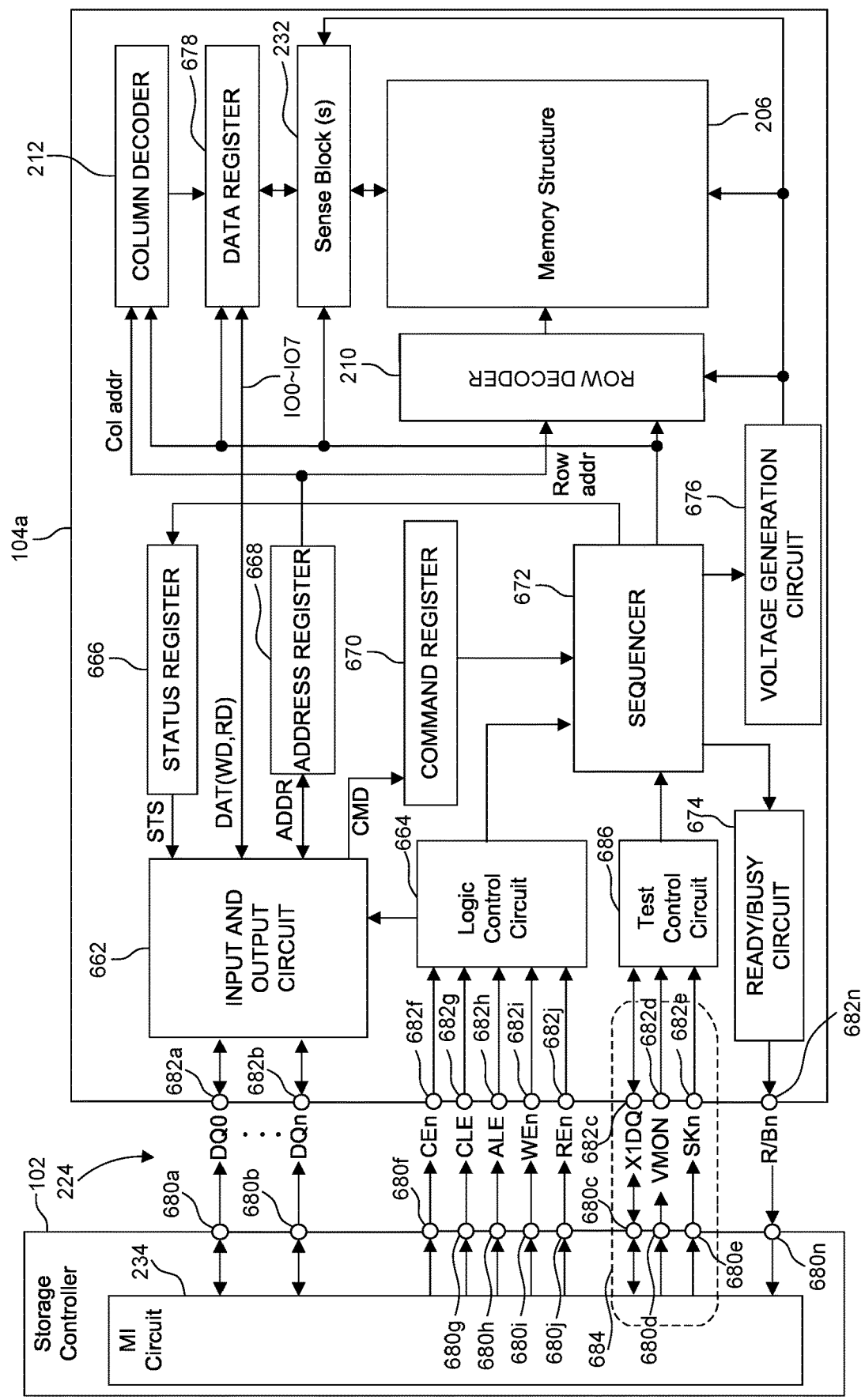
FIG. 6 is a block diagram of example memory system that depicts more details of an example embodiment of memory die, in connection with which, example embodiments of the disclosed technology can be implemented.

FIG. 6 is a block diagram of example memory system 600 that depicts more details of one embodiment of memory die 104a. With reference to FIG. 2B above, the memory die 104a is connected to the storage controller 102 via a memory interface 224 and operates based on commands from the storage controller 102. For example, the memory die 104a transmits and receives, for example, 8-bit signals DQ0 to DQn (hereinafter simply referred to as signals DQ or signals DQ [n:0], where n is an integer of the number of lines) to and from the storage controller 102. In various embodiments, the number of DQ signals may be 7, thus DQ [n:0] may be DQ[7:0]. The signals DQ [n:0] may include, for example, data, address codes, and command codes. The memory die 104a receives, for example, a chip enable signal (CEn), a command latch enable signal (CLE), an address latch enable signal (ALE), a write enable signal (WEn), and a read enable signal (REn) from the storage controller 102. Then, the memory die 104a transmits a ready/busy signal (R/Bn) to the storage controller 102.

The chip enable signal CEn is a signal for enabling the memory die 104a and is asserted, for example, at a logic LOW level. The CLE signal is a signal indicating that the DQ signal is encoded with a command code (also referred to as CMD) and is asserted, for example, at a logic HIGH level. The ALE signal is a signal indicating that the signal DQ is encoded with an address code (also referred to as ADDR) and is asserted, for example, at the logic HIGH level. The WEn signal is a clock signal for sampling a received signal in the memory die 104a. For example, a received signal is sampled and latched at each rising or falling edge of the WEn signal to obtain a bit pattern encoded into the received signal. Accordingly, a signal DQ is received in the memory die 104a when the WEn signal is toggled. The REn signal is a signal used for the storage controller 102 to read data from the memory die 104a. For example, data is read out of the memory die 104a at each rising or falling edge of the REn signal. Accordingly, the memory die 104a outputs the signal DQ to the storage controller 102 based on the toggled REn signal. The R/Bn signal is a signal indicating whether the memory die 104a is in a busy state or a ready state (in a state in which a command is not receivable or receivable from the storage controller 102) and is considered to be at the logic LOW level, for example, when the memory die 104a is in the busy state.

The storage controller 102 issues a read command, a write command, an erasing command, or the like to the memory die 104a in response to a command from a host device (e.g., host device 106 and/or 112). The storage controller 102 manages a memory space of the Memory die 104a.

As described above, the memory interface circuit 234 connects to the input/output circuit 222 via a plurality of pins (also referred to as electrical contact pads) the memory interface 224. For example, the storage controller 102 includes a plurality of pins 680a-n that are connected to a plurality of pins 682a-n of the memory die 104a. The memory interface circuit 234 transmits the CEn signal, CLE signal, ALE signal, and WEn signal to the memory die 104a via control bus 226 of the memory interface and transmits DQ [n:0] signals via the data bus 228 of the memory interface 234. The input/output circuit 222 transmits the R/Bn signal to the storage controller 102 via the control bus 226 and the DQ [n:0] signals via the data bus 228.

As illustrated in FIG. 6, the memory die 104a includes an input and output circuit 662, a logic control circuit 664, a status register 666, an address register 668, a command register 670, a sequencer 672, a ready/busy circuit 674, a voltage generation circuit 676, and a data register 678. The various components 662-678 may be included comprised as part of the die controller 204, for example, as part of the control circuit 214 and/or decoder circuit 216. FIG. 6 also illustrates the memory structure 206, row decoder 210, a sense blocks 232, and column decoder 212, as described above in connection with FIG. 2B.

The input and output circuit 662 controls input and output of the signal DQ to and from the storage controller 102. For example, the input and output circuit 662 transmits data received from the storage controller 102 as DIN to data register 678, transmits an address code to the address register 668, and transmits a command code to the command register 670. The input and output circuit 662 also transmits status information STS received from the status register 666, data received from the data register 678 to be transmitted to the storage controller 102 as DOUT, and an address code received from the address register 668 to the storage controller 102. STS, DOUT, and the address are transmitted as signals DQ encoded with a bit pattern for the STS, DOUT, or address. The input and output circuit 662 and the data register 678 are connected via a data bus. For example, the data bus includes eight I/O data lines IO0 to IO7 corresponding to the 8-bit signals DQ0 to DQ7. The number of I/O data lines is not limited to eight, but may be set to 16, 32, or any number of data lines.

The logic control circuit 664 receives, for example, the CEn signal, the CLE signal, the ALE signal, the WEn signal, and the REn signal from the storage controller 102 via control bus 226. Then, logic control circuit 664 controls the input and output circuit 662 and the sequencer 672 in accordance with a received signal.

The status register 666 temporarily stores status information STS, for example, in a write operation, a read operation, and an erasing operation for data and notifies the storage controller 102 whether the operation normally ends.

The address register 668 temporarily stores the address code received from the storage controller 102 via the input and output circuit 662. For example, the input and output circuit 662 may detect a signal DQ and sample the signal according to the WEn signal to obtain a bit pattern encoded thereon. The input and output circuit 662 may then decode the bit pattern to obtain the data, which in this case may be an address code. The address code is then temporarily stored in the address register 668. Then, the address register 668 transmits a row address (row addr) to the row decoder 210 and transmits a column address (col addr) to the column decoder 212. In various embodiments, the address code may include row and column, as well as a wordline selection, memory block selection, memory string selection, plane selection and die selection. Each of which are transmitted by the address register 668 to the row decoder 210 and/or the column decoder 212.

The command register 670 temporarily stores the command code received from the storage controller 102 via the input and output circuit 662 and transmits the command CODE to the sequencer 672. For example, the input and output circuit 662 may detect a signal DQ and sample the signal according to the WEn signal to obtain a bit pattern encoded thereon. The input and output circuit 662 may then decode the bit pattern to obtain the data, which in this case may be a command code. The command code is then temporarily stored in the command register 670.

The sequencer 672 controls operation of the memory die 104a. For example, the sequencer 672 controls the status register 666, the ready/busy circuit 674, the voltage generation circuit 676, the row decoder 210, the sense blocks 232, the data register 678, the column decoder 212, and the like according to a command code stored in the command register 670 to execute the write operation, the read operation, and the erasing operation according to the code.

The ready/busy circuit 674 transmits the R/Bn signal to the storage controller 102 according to an operation state of the sequencer 672. For example, the R/Bn signal is transmitted to the storage controller 102 via the control bus 626 of the memory interface 624.

The voltage generation circuit 676 generates a voltage necessary for an operation (e.g., a write operation, a read operation, or an erasing operation) according to control of the sequencer 672. The voltage generation circuit 676 supplies the generated voltage, for example, to the memory structure 206, the row decoder 210, and the sense blocks 232. The row decoder 210 and the sense blocks 232 apply a voltage supplied from the voltage generation circuit 676 to memory cells in the memory structure 206. Details of the memory structure 206 are provided in connection with FIGS. 3-4G above.

The data register 678 includes a plurality of latch circuits. The latch circuit stores the write data WD and the read data RD. For example, in a write operation, the data register 678 temporarily stores the write data WD received from the input and output circuit 662 and transmits the write data WD to the sense blocks 232. For example, in a read operation, the data register 678 temporarily stores the read data RD received from the sense blocks 232 and transmits the read data RD to the input and output circuit 662.

Furthermore, a test interface 684 (also referred to as a by 1 or X1 interface) may be used to execute die (or chip) level performance testing tasks, according to a testing protocol (as described in connection with FIG. 7 below) during manufacture, prior to packaging and shipment for sale to consumers. For example, an X1 interface was conventionally used in wafer sort testing. More particularly, the X1 interface may be used to test any properties of the memory die (e.g., wafer) needed at wafer sort, such as, but not limited to, trimming operations of all the voltage generators in the memory device; data latch testing; wordline, string, block, and plane memory array testing with each erase/program/read mode in order to decide whether there are bad wordlines or memory blocks; or column related testing in order to enable column redundancy settings. In conventional implementations, wafer sort testing requires probe cards and testers that only access the X1 protocol on the X1 interface. This is required so that the tester, probe cards will not touch down on pins designated for user data, such as IO[n:0], ALE, CLE, etc. Thus, the X1 interface make it much cheaper for manufacturing testing.

The memory die 104a includes a designated test control circuit 686 that is connected to the storage controller 102 via the test interface 684. The test control circuit 686 is separate and distinct from the logic control circuit 664 and contains the probe cards and testers for performing the test protocol on the test interface 684. While the memory interface 224 includes multiple buses for different data (e.g., a control bus for command/address sequencing, a data bus for DIN/DOUT data operations, etc.), the test interface 684 comprises a single bus (referred to herein as a test data bus) on which all data is exchanged. For example, command/address sequencing, along with all data operations are performed on the single test data bus. While the signal lines and associated pins have been generally used only for testing prior to public sale, the memory die 104a is shipped with the interface and pins present but unused for consumer data.

The storage controller 102 may transmit and receive signals according to the testing protocol over the test data bus of the test interface 684. For example, the storage controller 102 may transmit a monitoring voltage (VMON) signal for enabling or otherwise triggering the testing protocol on the memory die 104a and is asserted, for example, at a logic HIGH level. The storage controller 102 transmits the VMON signal to the memory die 104a via the control bus 226 of the test interface 684. For command/address sequencing and DIN/DOUT operations between the memory die 104a and the storage controller 102, a single data line X1DQ is used to provide a 1-bit X1DQ signal for all data exchanges between the storage controller 102 and the test control circuit 686 of the memory die 104a. Under the testing protocol, the eight data lines IO0 to IOn are not utilized. The X1DQ signal (also referred to herein as a 1-bit I/O data signal) may include, for example, DIN/DOUT, addresses, and commands. For example, the X1DQ signal may be encoded to indicate the CEn signal, CLE signal, ALE signal, RE signal, data signals, command signals, and address signals, each signal serially provided in a 1-bit sequence, over the X1DQ signal. The test control circuit 686 then applies the test protocol to the received signal in order to decipher what data is coming in and/or out, for example, whether the data is a command, an address, DIN/DOUT, etc. Then, the test control circuit 686 controls input and output of data and the sequencer 672 in accordance with a received signal. The storage controller 102 also transmits a 1-bit SKn signal, which is a clock signal for sampling a received signal in (e.g., write into the memory die 104a) and reading data from the memory die 104*a*. The SKn signal is asserted, for example, at the logic LOW level when a command, an address, data, or the like is received from the storage controller 102.

The test interface 684 may be a portion of the memory interface 234 corresponding to a subset of pins 682 and 680, as shown in FIG. 6. For example, memory die 104*a* includes pins 682*c*, 682*d*, and 682*e* of the test control circuit 686 for connecting to pins 680*c*, 680*d*, and 680*e* of the storage controller 102. Thus, the memory interface circuit 234 transmits the VMON signal, SKn signal, X1DQ signals via the test data bus of the test interface 284 to the test control circuit 686.

Figure 7:
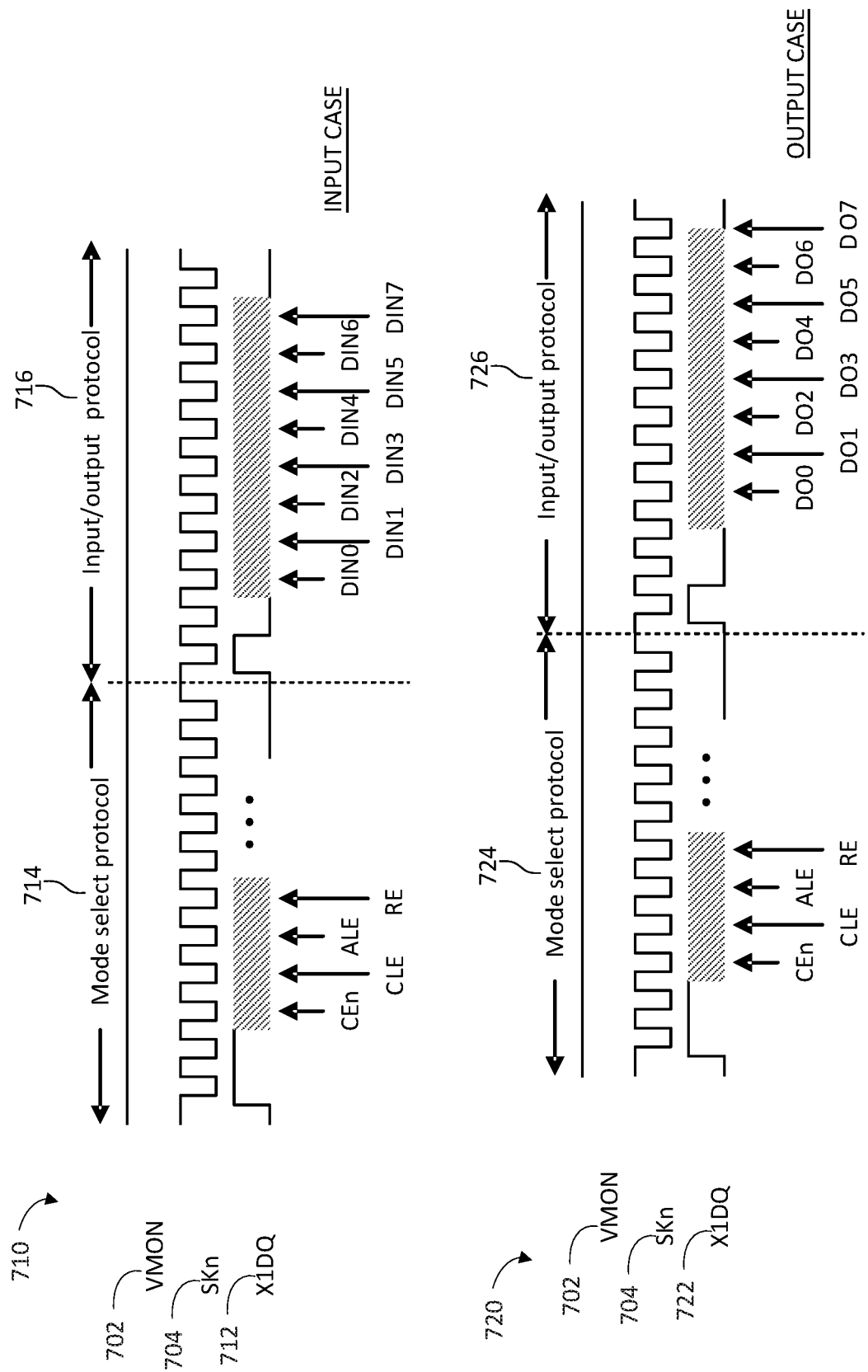
FIG. 7 illustrates example timing diagrams of signals associated performance testing of the memory device of FIGS. 2A and 2B, in connection with which, example embodiments of the disclosed technology can be implemented.

FIG. 7 illustrates example timing diagrams 710 and 720 of signals associated performance testing of the memory device 200. Timing diagram 710 illustrates an example test write operation performed on a memory die 104*a* and timing diagram 720 illustrates an example test read operation performed on memory die 104*a*. Timing diagrams 710 and 720 include a plurality of signals for performing the respective operations exchanged over a test interface (e.g., test interface 684 of FIG. 6), which include a VMON signal 702, an SKn signal 704, X1DQ data signal 712, and X1DQ data signal 722. The X1DQ data signal 712 and X1DQ data signal 722 may be representative of signals on the same test bus or lines, one in the case of the write operation of diagram 710 and one in the case of the read operation of diagram 720. The timing diagram 710 is divided into a mode select protocol portion 714 and a data input protocol portion 716. The timing diagram 720 is similarly divided into a mode select protocol portion 724, which is the same as mode select protocol portion 714, and data output protocol portion 726.

The testing protocol starts with the storage controller 102 asserting VMON at the logic HIGH level, to trigger the testing protocol and notify the memory die 104*a* that performance testing is to be performed over the test interface. As illustrated in FIG. 7, once triggered and during the mode select protocol portion 714, the storage controller transmits a mode select signal encoded with a first bit pattern as a 1-bit data sequence on the X1DQ signal 712. The first bit pattern includes a bit for asserting each of a plurality of control signals, asserted as logic HIGH or logic LOW levels, to notify the memory die 104*a* of a selected mode and inform the memory die 104*a* that a bit pattern in the input/output protocol portion 716 is encoded with a control signal for the selected mode. The memory die 104*a* detects the mode select signal and samples the mode select signal according to the SKn signal 704 to obtain the first bit pattern. The memory die 104*a* then decodes the first bit pattern as a control signal of the selected mode. Example, modes include, but are not limited to, CEn, CLE, ALE, RE, to name a few. For example, to indicate a command cycle, an example first bit pattern encoded into the X1DQ signal 712 is 0100, where for the first bit at logic LOW level for the CEn mode; the second bit at logic HIGH level for the CLE; and the bits at logic LOW level for ALE, and RE. Other bits may be set to indicate other modes as desired for testing the memory die 104*a*.

After the mode select protocol portion 714, the storage controller then generates a data signal on the X1DQ signal 712 encoded with a second bit pattern of data for the selected mode. For example, The memory die 104*a* detects the data signal and samples the data signal according to the SKn signal 704 to obtain the second bit pattern. The memory die 104*a* then decodes the second bit pattern as the data for the selected mode.

Which portion 714 (or 724) or 716 (726) of the testing protocol is indicated by the SKn signal 704. For example, the two consecutive bits of on the SKn signal 704 may be utilized to indicate change between portion 714 and portion 716 (or portions 724 and 726). In the case of the mode select protocol portion 714 (or 724), two consecutive bits at logic HIGH level may indicate to the test control circuit 686 that data on the X1DQ signal 712 (or 722) is encoded with the first bit pattern for mode selection. Then consecutive bits at logic LOW level on the SKn signal 702 may indicate the mode selection protocol is complete. In the case of input/output protocol portion 716 or 726, a first bit on the SKn signal 702 at logic HIGH level followed by a consecutive bit at logic LOW level may indicate to the test control circuit 686 that data on the X1DQ signal 712 (or 722) is encoded with the second bit pattern of data for the selected mode.

An example CLE mode will be provided here. For example, during the mode select protocol portion 714, the storage controller generates a mode select signal encoded with a first bit pattern to instruct the memory die 104*a* to enter a CLE mode. In this case, the first bit pattern may assert a second bit as logic HIGH level, while asserting the other bits as logic LOW level. The mode select signal is transmitted from the storage controller 102 to the memory die 104*a* via the test data bus of the test interface 684. The memory die 104*a* detects the X1DQ signal and, at each rising or falling edge of the SKn signal 704, samples and latches a bit value in the mode select signal to obtain the first bit pattern. The memory die 104*a* (e.g., at the control circuit 214) decodes the first bit pattern to identify that CLE mode is selected. During the input/output protocol portion 716, the storage controller generates a data signal encoded with a second bit pattern that is a command code. For example, the storage controller 102 may encode bits D0-D7 of the data signal as 00000000 for command code 00 h, 00110000 for command code 30 h, and 10101010 for command code 55 h, to name a few examples. As introduced above and shown in FIGS. 7A and 7B, there are is a two cycle header (e.g., used to indicate which portion of the test protocol is currently implemented) and a dummy cycle, which total 11 cycles of the SKn signal 702. The data signal is transmitted from the storage controller 102 to the memory die 104*a* via the test data bus of the test interface 684. The memory die 104*a* detects the X1DQ signal and, at each rising or falling edge of the SKn signal 704, samples and latches a bit value in the data signal to obtain the second bit pattern. The memory die 104*a* (e.g., at the control circuit 214) decodes the second bit pattern to retrieve the command code. The command code is then processed as set forth above in connection with FIG. 6, for example, by storing the command code in the command register 670.

An example ALE mode will now be provided. For example, during the mode select protocol portion 714, the storage controller generates a mode select signal encoded with a first bit pattern to instruct the memory die 104*a* to enter an ALE mode. In this case, the first bit pattern may assert a third bit as logic HIGH level, while asserting the other bits as logic LOW level. The mode select signal is transmitted from the storage controller 102 to the memory die 104*a* via the test data bus of the test interface 684. The memory die 104*a* detects the X1DQ signal and, at each rising or falling edge of the SKn signal 704, samples and latches a bit value in the mode select signal to obtain the first bit pattern. The memory die 104*a* (e.g., at the test control circuit 686) decodes the first bit pattern to identify that ALE mode is selected. During the input/output protocol portion 716, the storage controller generates a data signal encoded with a second bit pattern that is an address code. For example, the storage controller 102 may encode bits D0-D7 of the data signal as 00100000 for the first bit pattern, as an address code to select a wordline 1 of string 0. The data signal is transmitted from the storage controller 102 to the memory die 104a via the test data bus of the test interface 684. The memory die 104a detects the X1DQ signal and, at each rising or falling edge of the SKn signal 704, samples and latches a bit value in the data signal to obtain the second bit pattern. The memory die 104a (e.g., at the control circuit 214) decodes the second bit pattern to retrieve the address code. The address code is then processed as set forth above in connection with FIG. 6, for example, by storing the address code in the address register 668.

Conventionally, the testing protocol, using the test interface and associated pins, is implemented only during manufacture for chip and memory system verifications, prior to packaging for shipment for sale and consumer use. Traditionally, these pins and related test interface is not used for data operations related to consumer user data or control signals for effectuating these data operation. Instead, the control signals and data are transmitted and received using the CEn, CLE, ALE, WEn, REn, and DQ signals.

Figure 8A:
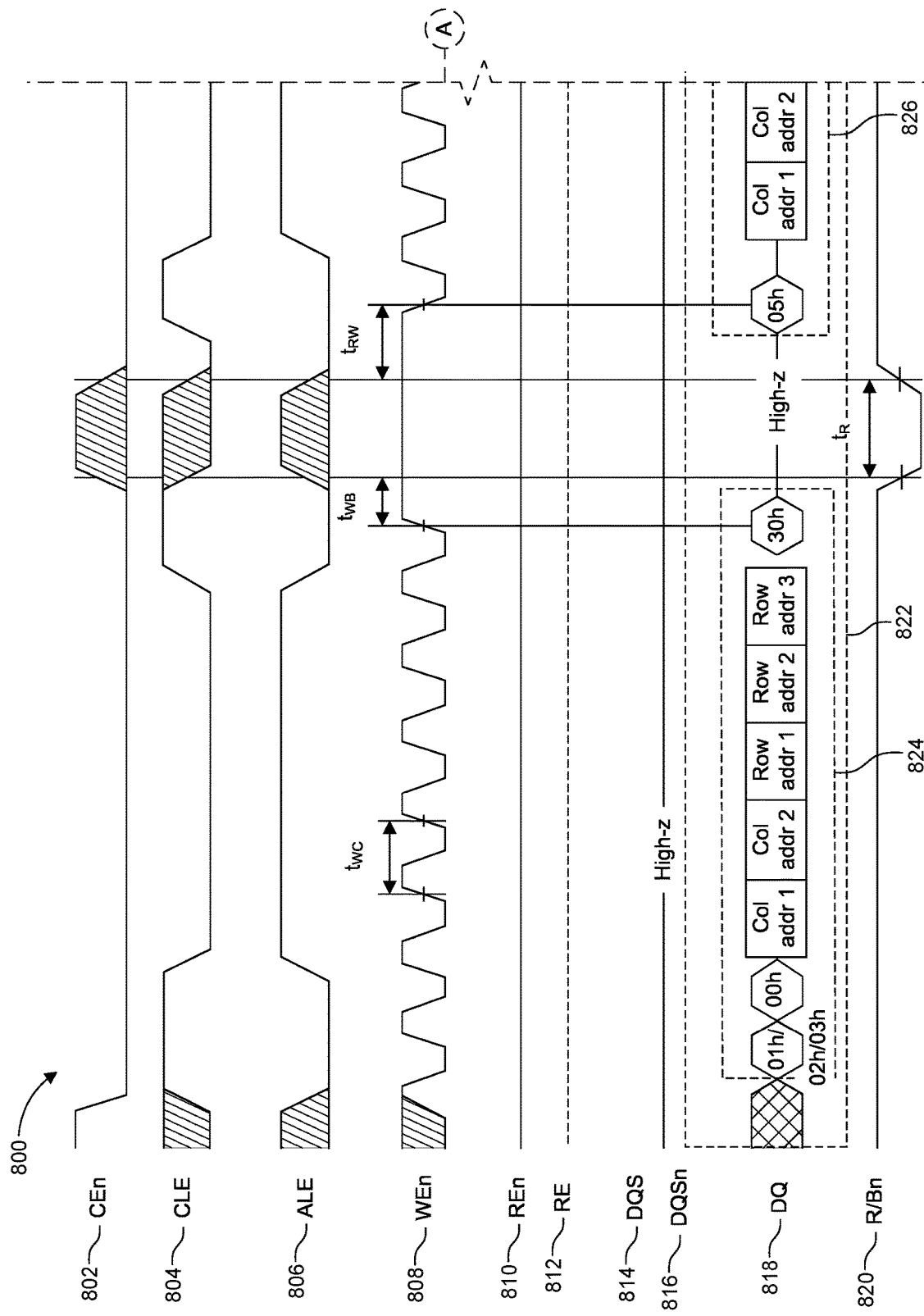
FIGS. 8A and 8B illustrate another example timing diagram of signals associated with a data out (DOUT) operation from a memory device, in connection with which, example embodiments of the disclosed technology can be implemented.
Figure 8B:
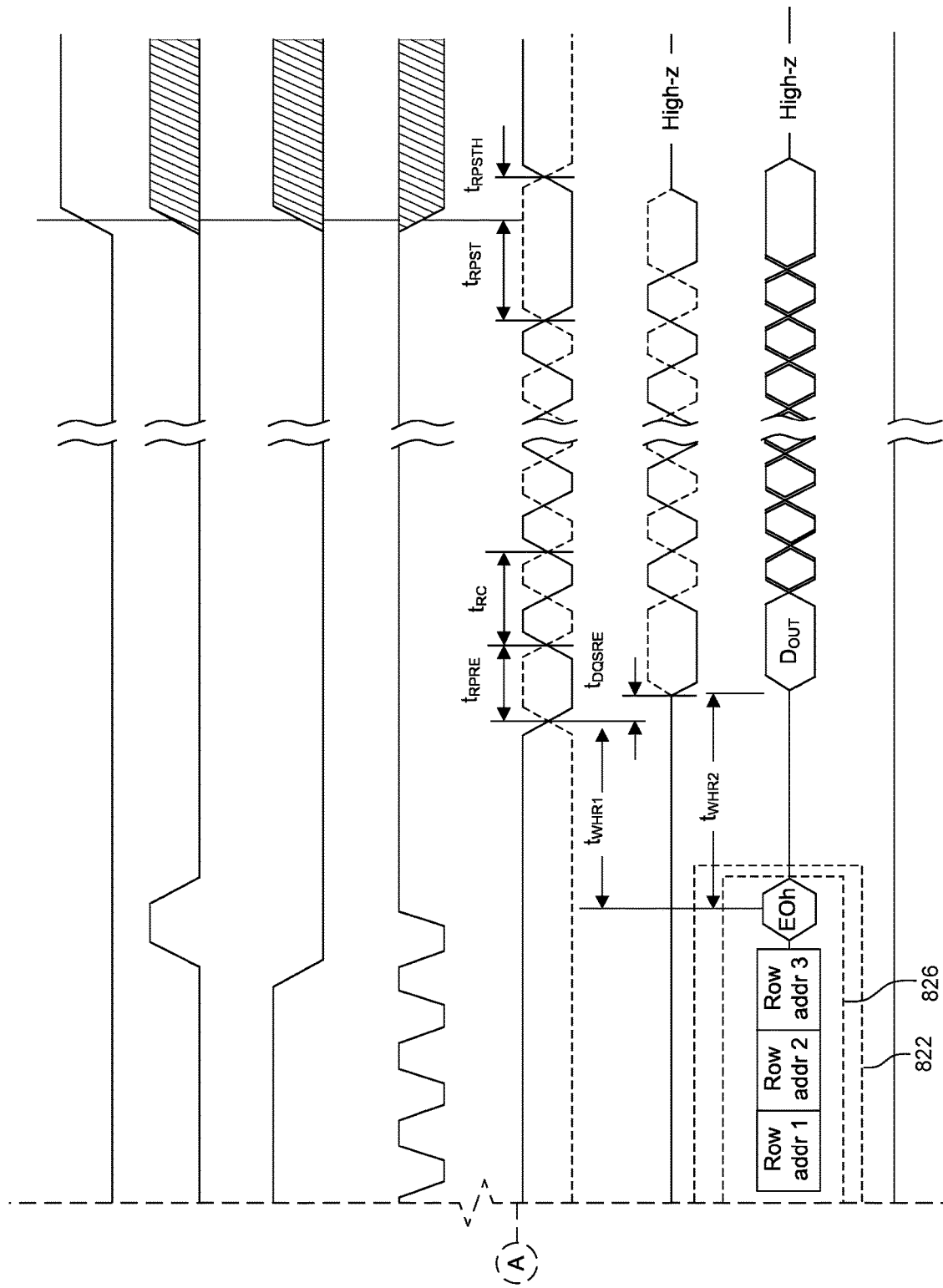

FIGS. 8 and 8B illustrate an example timing diagram 800 of signals associated with a read command from a memory device. Timing diagram 800 depicts an example DOUT operation (e.g., read operation) performed on a memory device (e.g., memory device 200) based on one or more signals exchanged between a controller (e.g., storage controller 102) and a memory die (e.g., memory die 104a) via a memory interface (e.g., memory interface 230). Timing diagram 800 includes a plurality of signals for performing the DOUT operation, which includes an active-low chip enable (CEn) signal 802, an active-high command latch enable (CLE) signal 804, an active-high address latch enable (ALE) signal 806, an active-low write enable (WE) signal 808, an active-low read enable (REn) signal 810, an active-high read enable (RE) signal 812, an active-high data strobe (DQS) signal 814, an active-low data strobe (DQS) signal 816, an I/O data signal 818, and a ready/busy (R/Bn) signal 820.

In the illustrative example of FIGS. 8A and 8B, the memory die executes a read operation 822 based on a command received from the storage controller. The read operation 822 comprises a cell read operation 824 during which data is read from a memory cell of the memory die and a register (or cache) read operation 826 during which data is read from a register.

First, as illustrated in FIGS. 8A and 8B, the storage controller 102 transmits a cell read command in the form of a bit pattern clocked with respect to the WEn signal 808, which the memory die 104a decodes to a command code and an address code (e.g., an address of the cell from which data is to be read). The period of the WEn signal 808 is "$t_{WC}$". For example, the storage controller asserts the CLE signal 804 to the logic HIGH level to notify the memory die that a command code is being transmitted. The storage controller transmits a page control command code, such as command code "01 h/02 h/03 h", where 01 h is a lower page, 02 h is a middle page, and 03 h is an upper page. The storage controller then transmits a bit pattern on the I/O signal 818 encoded with a command code, which the memory die 104a detects and samples according to the WEn signal 808 to obtain command code "00 h" to notify the memory die to execute the cell read command. The command code is latched into a command register (e.g., command register 670 of FIG. 6).

The storage controller also asserts the ALE signal 806 to the logic HIGH level (and asserts the CLE signal 804 to logic LOW level) and transmits the address of the memory cell on the I/O signal 818 as a bit pattern encoded with an address code. The memory die detects the signal, samples the signal according to the WEn signal 808 to obtain the bit pattern, and decodes the bit pattern to obtain the address code. The address code is latched into an address register (e.g., address register 668 of FIG. 6). In the example of FIGS. 8A and 8B, the row address (Row addr) is transmitted by three cycles after the column address (Col addr) is transmitted by two cycles. However, any number of cycles may be used for providing the column address and the row address.

Subsequently, the storage controller asserts the CLE signal 804 to the logic HIGH level and the transmits a cell read command "30 h" encoded into a bit pattern. The command code "30 h" instructs the memory die to execute the cell read operation using the address code stored on the address register. At this time, the R/Bn signal 820 set to the logic LOW level (e.g., busy state). A sense circuit of the sense block (e.g., a sense block 232) reads the data from the memory cell corresponding to the address code from the address register. The sense circuit subsequently transmits the read data to a data register (e.g., data register 678 of FIG. 6). The period in which the sense circuit starts the reading of the data from the memory cell and ends the transmission of the read data to the data register is shown a "$t_R$". The R/Bn signal 820 is set at the logic LOW level during the period $t_R$.

When the storage controller confirms that the R/Bn signal 820 returns to the logic high level (e.g., ready state), the storage controller transmits a register read command to the memory die. For example, the storage controller asserts the CLE signal 804 to the logic HIGH level and transmits a command code "05 h", on the I/O signal 818, to the memory die to notify the memory die to execute the register read operation. The storage controller asserts the ALE signal 806 to the logic HIGH level and transmits the address code on the I/O signal 818. In the example of FIGS. 8A and 8B, the row address (Row addr) is transmitted by three cycles after the column address (Col addr) is transmitted by two cycles. However, any number of cycles may be used for providing the column address and the row address. Subsequently, the storage controller asserts the CLE signal 804 to the logic HIGH level and transmits a register read command "E0 h" to instruct the memory die to execute the register read operation.

The memory die starts the register read operation according to the register read command code "E0 h". For example, the storage controller transmits the REn signal 810 with the logic LOW level after a waiting period $t_{WHR1}$ elapses from rising edge of the WEn signal 808 (e.g., from logic LOW level to logic HIGH level) corresponding to the command "E0 h". The memory die then starts reading of the data from the register and, after a waiting period $t_{WHR2}$ elapses, starts transmitting the read data as DOUT, on the I/O signal 818, to the storage controller clocked according to the DQS signal 814. Waiting period $t_{WHR2}$ is a period of time that the memory die 104a (e.g., input and output circuit 662) takes to decode command code "E0 h" and for the memory die 104a to fetch data from a cache buffer (e.g., data register 678) over pipeline states due to such cache buffers being some distance from the pins (e.g., pins 682a-682b for the DQ signal of FIG. 6). For example, internal logic needs to be enabled, initial column address needs to be decoded and deciphered whether column redundancy replacement had occurred on specific column, and then moving data from the requested plane, column through the pipeline. Then when the RE signal toggles, data will be available immediately from last stage of pipeline to pins of the DQ signals. The embodiments herein utilize the X1 interface and protocol as described herein, which provides a benefit to hide this type of overhead while DQ signal is used for DIN/DOUT operations.

The total register read time is amount of time to perform register (or cache) read operation 826 plus the amount of time to transmit DOUT to the storage controller. That is, the total register read time is the sum of the period from the falling edge of the WEn signal 808 corresponding to the command code "05 h" to the rising edge of the WEn signal 808 corresponding to the command code "E0 h", the waiting period $t_{WHR2}$, and the time period to transmit DOUT to the storage controller "$t_{DOUT}$" (also referred to herein as data toggle out time). The period from the falling edge of the WEn signal 808 corresponding to the command code "05 h" to the rising edge of the WEn signal 808 corresponding to the command code "E0 h" may correspond to the period of the WEn signal 808 $t_{WC}$ multiplied by a multiplier, which is an integer equal to the number of cycles of the WEn signal 808 required to complete the register read operation 826. That is, with reference to the example in FIGS. 8A and 8B, the register read time of timing diagram 800 is $t_{WC} \times 7 + t_{WHR2} + t_{DOUT}$, where seven cycles of the WEn signal 808 are required to complete the register read operation 826.

As an illustrative example, $t_{WC}$ may be 10 ns and the waiting period $t_{WHR2}$ may be 300 ns. The example values for $t_{WC}$ and $t_{WHR2}$ are merely used as examples of the current state of the art. Other values would be equally applicable. In this example case, the total register read time is 370 ns plus the data toggle out time $t_{DOUT}$. The data toggle out time $t_{DOUT}$ is based on the size of the data and the data I/O speed corresponding to a Toggle Mode. Table 1 below illustrates example data toggle out times $t_{DOUT}$ in ns for three data sizes and three Toggle Modes, where the number following TM indicates the number of megabytes per second for processing DIN/DOUT operations.

|  | TM1600 | TM3200 | TM4800 |
|---|---|---|---|
| 4K byte | 2867 | 1434 | 956 |
| 16K byte | 11468 | 5734 | 3823 |
| 64K byte | 45873 | 22936 | 15291 |

The total register read time is a critical performance indicator of the memory device. Performance and speed considerations of data read operations are generally gauged based on the register read time, opposed to the entire read operation time (e.g., entire time for read operation 820). That is, the time from command code "05 h" to code "E0 h" is generally used to gauge the performance of the read operation. This is because, read out from the memory cell to the register during time $t_r$ is significantly longer and will dominate the time period. Read out from the memory cell is an operation internal to the memory die (e.g., from memory structure to command and/or address register), which is not dispositive of the speed of at the memory interface (e.g., the I/O signals and/or control signals). I/O speeds continue to increase, but similar increases have not occurred on the command/address sequencing. Thus, evaluating the register read time as set forth above is representative of the performance of the command/address sequencing of the memory device.

Additionally, once command code "30 h" is issued and the memory die is busy, the DQ signal 818 can be used to issue command/address codes to other dies, while the current memory die 104a is sensing from memory array. This not possible during between the command codes "05 h" and "E0 h." The codes "05 h" to "E0 h" to data streaming out requires atomic sequence control. Thus, the storage controller cannot issue 05 h-address-E0 h and perform other sequence to another memory die or same memory die for a different operation, and then come back to stream out data. In this case, the overhead of command/address sequencing and $t_{WHR2}$ is visible and gates the data bus usage for memory device.

FIGS. 8A and 8B depict command and address sequencing that require use of I/O signals 818 (e.g., over the data bus 228 of memory interface 224) to provide command/address information to a memory device. As such, when command or address information is received on the data bus, DIN/DOUT operations cannot be performed on the data bus. Thus, even as DIN/DOUT speeds increase, the command and address sequences depicted in FIGS. 8A and 8B remain a bottleneck for system performance because they utilize the same data bus to send command and address information to a memory device as DIN/DOUT operations use to provide data to and/or receive data from the memory device.

Accordingly, embodiments herein separate the command/address sequencing from the data bus, I/O signals, and related data I/O pins. Embodiments herein provide commands and address sequencing for read/write operations using a test data bus that is separate from the data bus used for a DIN/DOUT operation for read/write operations. Furthermore, using separate bus and data signal frees up the data bus for DIN/DOUT operations. Thus, command/address sequencing can be performed in the background, parallel, and simultaneously with DIN/DOUT operations, which reduces overall data processing overhead by hiding command/address sequencing processing overhead in the background. For example, referring to the above example, the 370 ns of overhead for performing the register read operation 826 plus other overhead for the rest of operation 822 may be hidden during a multi-die data operation (examples of which are described below in connection FIGS. 9-12). That is, the command/address sequencing for a first read/write operation and its corresponding overhead may be performed on a first memory die, while a DIN/DOUT operation for a second read/write operation is be performed on a second memory die. Subsequently, the first memory die can perform a DIN/DOUT operation corresponding to the first read/write operation. Further, the second memory die may perform command/address sequencing for a third read/write operation, while the first memory die is performing the DIN/DOUT operation for the first read/write operation. Thus, embodiments of the disclosed technology may perform command/address sequencing corresponding to a next read/write operation for a first memory die in parallel with performing a DIN/DOUT operation corresponding to a current read/write operation for a second memory die.

Figure 9:
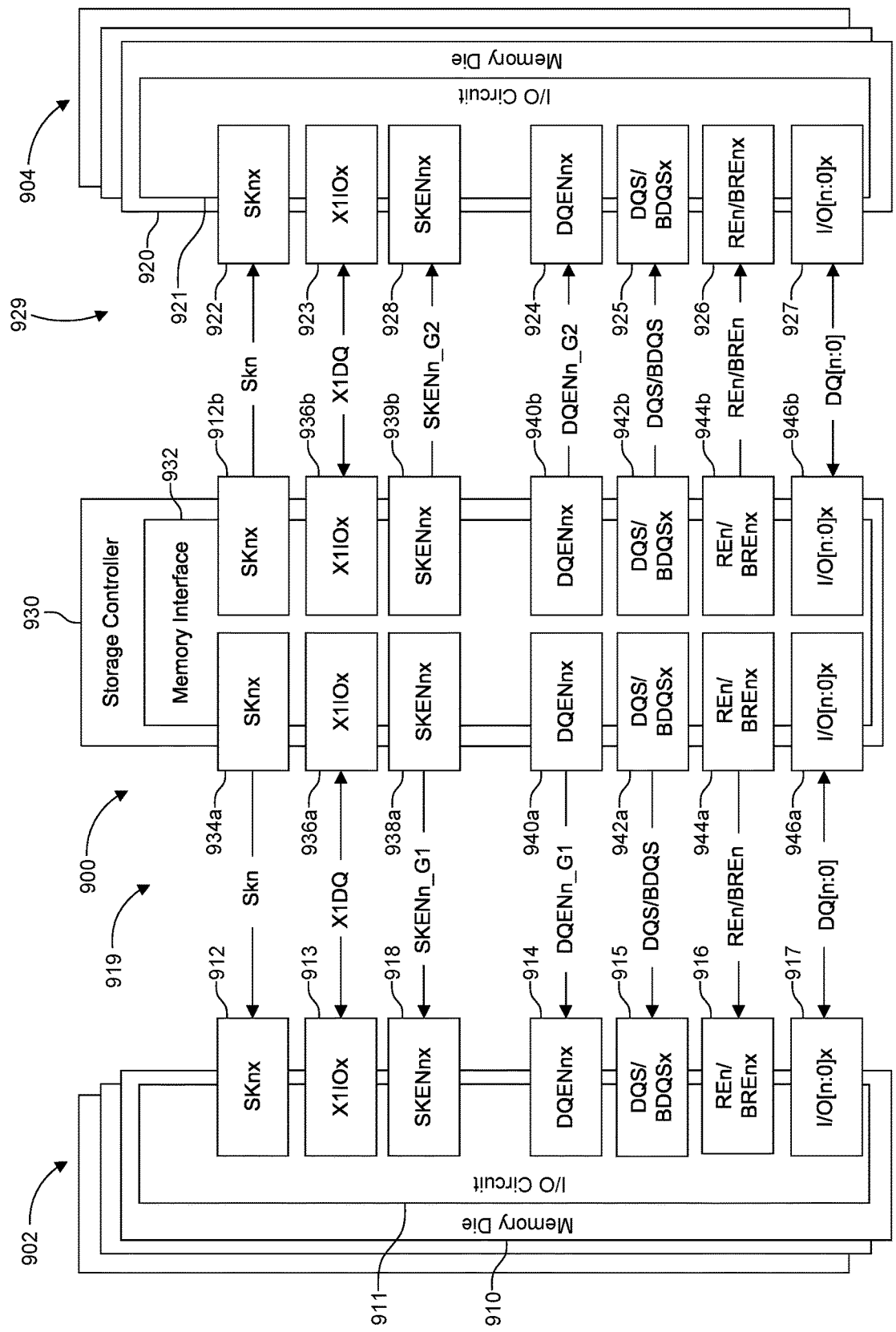
FIG. 9 is a block diagram of example memory system for multi-memory die data operations, in accordance with embodiments of the disclosed technology.

FIG. 9 is a block diagram of example memory system 900 for multi-memory die data operations, in accordance with embodiments of the disclosed technology. The memory system 900, which is substantially similar to memory system 100 of FIG. 1, includes a storage controller 930, a first memory array 902, and a second array 904. The storage controller 930 is substantially similar to storage controller 102 of FIG. 1 except as provided below. The first and second memory arrays 902 and 904 may be substantially similar to the memory array 202 of FIG. 2B. Thus, each memory array 902 and 904 comprises a plurality of memory dies 910 and 920, respectively. The following description is made with reference to each memory die in the singular; however, the disclosure herein applies equally to each memory die of a respective memory array. Thus, as used herein, memory die 910 may refer to any one of the memory dies of the memory array 902 and memory die 920 may refer to any one of the memory dies of the memory array 904. Each memory die 910 and 920 is substantially similar to the memory die 104a described in connection with FIGS. 2A-8B, except as provided below.

Referring to memory die 910, a I/O circuit 911 of the memory die 910 is connected to a memory interface circuit 940 (e.g., memory interface circuit 234 of FIG. 2B) of the storage controller 930 via a memory interface 919 (e.g., memory interface 224 of FIGS. 2A and 2B) and operates based on commands from the storage controller 930. For example, the memory die 910 transmits and receives, for example, 8-bit signals DQ [7:0] to and from the storage controller 930, for example, similar to the I/O circuit 222 of FIG. 2A. In various embodiments, the signals DQ [7:0] include DIN/DOUT. The memory die 910 transmits and receives, for example, a 1-bit signal X1DQ to and from the storage controller, for example, similar to the test control circuit 686 of FIG. 6. In various embodiments, the signal X1DQ includes command and address used for command/address sequencing. Additionally, the memory die 910 receives, for example, an active-low command/address enable signal (SKENn), a command/address clock signal (SKn) (e.g., such as the SKn signal on the test control circuit 686), an active-low DIN/DOUT enable signal (DQENn), active-high and -low data strobe signals (QBS/BDQS), and active-high and -low read enable signals (REn/BREn) from the storage controller 930 (such as those on the I/O circuit 222). Then, the memory die 910 may transmit and receive one or more additional signals to and from the storage controller 930 as set forth above, for example, in connection with FIG. 6.

The SKENn signal is a signal for enabling command/address sequencing on the memory die 910 and is asserted, for example, at a logic LOW level to enable the command/address sequencing. In memory system 900, the X1DQ signal is a signal for receiving control signals and exchanging of data related to command/address sequencing, for example, according to the testing protocol as described above in connection to FIG. 7. For example, the X1DQ signal may include a 1-bit pattern that comprises one or more of a first bit encoded at logic HIGH level indicating to select a CLE mode and that that information encoded in signal X1DQ is a command code and a second bit asserted at logic HIGH level to select ALE mode and indicating that information encoded in the signal X1DQ is an address code. In some embodiments, additional bits of the X1DQ signal may by asserted at logic HIGH or LOW levels to select other modes, such as described above in connection with FIG. 7. The SKn signal is a clock signal for sampling a received signal in the memory die 910 (e.g., such as described above in connection with FIG. 7). Accordingly, a signal X1DQ is received in the memory die 910 when the SKn signal is toggled.

The DQENn signal is a signal for enabling DIN/DOUT on the memory die 910 and is asserted, for example, at a logic LOW level. The DQS/BDQS signal is a clock signal for sampling a received signal in the memory die 910 (e.g., latching bit values detected at each rising or falling edge of the DQS/BDQS signal to obtain an encoded bit patter). Accordingly, a signal DQ [n:0] is received in the memory die 910 when the DQS/BDQS signal is toggled. The REn/BREn signal is a signal used for the storage controller 102 to read data from the memory die 910. The REn signal is asserted, for example, at the logic LOW level. Accordingly, the memory die 910 outputs the signal DQ [n:0] to the storage controller 930 based on the toggled REn/BREn signal.

FIG. 9 depicts various pins included as part of the I/O circuit 911 and the memory interface circuit 940. A first subset of pins is used to perform the command and address sequence and a second subset of pins are used to perform DIN/DOUT operations. It should be appreciated that the character 'x' in each block element following a given acronym indicates that the block element is a pin for the signal identified in the block element. For example, block element SKnx 912 represents SKnx pin 912 for receiving the SKn signal on the memory die 910 and block element SKnx 934a represents SKnx pin 934a for transmitting the SKn signal from the storage controller 930. Accordingly, the memory die 910 comprises a first subset of pins including, but not limited to, SKnx pin 912, X1IOx pin 913 for transmitting and receiving control and data signals for command/address sequencing, and SKENnx pin 918 for receiving the SKENn signal. The storage controller 930 includes corresponding pins, such as SKNx pin 934a, X1IOx pin 936a, and SKENnx pin 938a. The memory die 910 also comprises a second subset of pins including, but not limited to, DQENnx pin 914 for receiving the DQENn signal, DQS/BDQS pin 915 for receiving the DQS/BDQS signal, REn/BREnx pin 916 for receiving the REn/BREn signal, and I/O[n:0]x for transmitting and receiving the DQ [n:0] signal. The storage controller includes corresponding pins, such as DQENnx pin 940a, DQS/BDQS pin 942a, REn/BREnx pin 944a, and I/O[n:0]x pin 946a. As described above, the memory interface circuit 940 connects to the I/O circuit 911 over the memory interface 919 via the plurality of pins. The first sub-set of bins (e.g., pins 912, 913, 918, 934a, 935a, and 938a) connects the memory interface circuit 940 connects to the I/O circuit 911 over the test interface (e.g., test interface 684 of FIG. 6).

With reference to FIG. 6, the memory die 910 also includes status register 666, address register 668, command register 670, sequencer 672, ready/busy circuit 674, voltage generation circuit 676, and data register 678. The I/O circuit 911 (e.g., implemented in a manner similar to input and output circuit 662) inputs the DQ [0:n] signa as DIN received from the storage controller 930 to data register 678. The I/O circuit 911 also receives address code and command code over the X1DQ signal and transmits the address to the address register 668 and the command code to the command register 670. The I/O circuit 911 also transmits DOUT received from the data register 678 to storage controller 930 over the DQ [n:0] signal and transmits an address code received from the address register 668 to the storage controller 102 over the X1DQ signal.

The I/O circuit 911 (e.g., implemented in a manner similar to logic control circuit 664) receives, for example, the SKENn signal and the SKn signal from the storage controller 930 via the test data bus of a test interface (e.g., test interface 684). The I/O circuit 911 receives, for example, the DQENnx signal, the DQS/BDQS signal, and the REn/BREn signal from the storage controller 930 via a control bus (e.g., control bus 226) of the memory interface 919. The internal functions of the memory die 910 proceeds in a manner substantially similar to memory die 104a as set forth in connection with FIG. 6. For example, I/O circuit 911 controls the input and output circuit 662 and the sequencer 672 in accordance with a received signal as described in connection with FIG. 6.

The memory die 920 of memory array 904 may function in a manner similar to memory die 910. Memory die 920 includes I/O circuit 921 (which may be substantially similar to I/O circuit 911) connected to a memory interface circuit 940 via a memory interface 929 (e.g., memory interface 224 of FIGS. 2A and 2B) and operates based on commands from the storage controller 930. For example, the memory die 920 comprises a first subset of pins including, but not limited to, SKnx pin 922 for transmitting an SKn signal from the storage controller 930, X1IOx pin 923 for transmitting and receiving control and data signals to storage controller 930 for command/address sequencing, and SKENnx pin 928 for receiving an SKENn signal from the storage controller 930. The storage controller 930 includes corresponding pins, such as SKNx pin 934b, X1IOx pin 936b, and SKENnx pin 938b. The memory die 920 also comprises a second subset of pins including, but not limited to, DQENnx pin 924 for receiving the DQENn signal from the storage controller 930, DQS/BDQS pin 925 for receiving the DQS/BDQS signal from the storage controller, REn/BREnx pin 926 for receiving the REn/BREn signal from the storage controller 930, and I/O[n:0]x for transmitting and receiving the DQ [n:0] signals to and from the storage controller 930. The storage controller 930 includes corresponding pins, such as DQENnx pin 940b, DQS/BDQS pin 942b, REn/BREnx pin 944b, and I/O[n:0]x pin 946b. As described above, the memory interface circuit 940 connects to the I/O circuit 921 over the memory interface 928 via the plurality of pins. The first sub-set of bins (e.g., pins 912, 913, 918, 934a, 935a, and 938a) connects the memory interface circuit 940 connects to the I/O circuit 911 over the test interface (e.g., test interface 684 of FIG. 6).

FIG. 9 depicts memory system 900 having multiple memory arrays 902 and 904. The term "G1" and "G2" following the acronyms SKENn and DQENn represent a "Group 1" and "Group 2" and indicates a given signal is associated with a respective group of memory dies or memory array. That is, the term "G1" indicates that the SKENn_G1 and DQENn_G1 signals are received by the memory array 902 (e.g., a first group of one or more memory dies), and the term "G2" indicates that the SKENn_G2 and DQENn_G2 signals are received by the memory array 904 (e.g., a second group of one or more memory dies). As used herein, a group of memory dies or a memory array may refer to one or more memory dies. The group of memory dies may be arranged in a memory die stack or otherwise. Furthermore, a single memory array (e.g., memory array 202 of FIG. 2A) may comprises a plurality of memory dies that are grouped into the first group and the second group. That is, the first group of memory dies may comprise one or more memory dies of a memory array and the second group of memory dies may comprise one or more memory dies of the same memory array, where the memory dies of contained in each group are separate and distinct memory dies. Thus, embodiments herein of multi-die operations may apply either inter-memory array (e.g., between memory dies of separate memory array) or intra-memory array (e.g., between memory dies of the same memory array).

Furthermore, embodiments herein are not limited to only two memory arrays as shown in FIG. 9 but may apply to any number of memory arrays for multi-die data operations. For example, embodiments herein may include three, four, five, or any number of groups of memory dies. Two groups are provided merely as an illustrative example to facilitate understanding.

Figure 10:
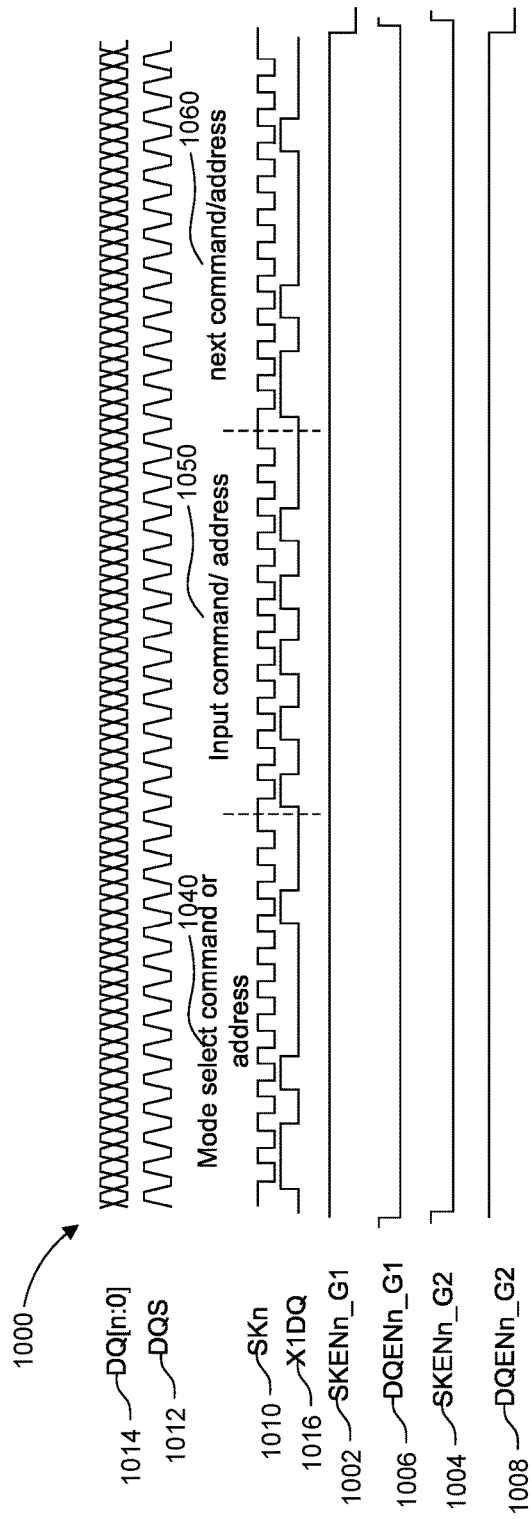
FIG. 10 schematically depicts an example timing diagram of signals for overlapping a data in (DIN) operation with a command/address sequencing, in accordance with embodiments of the disclosed technology.
Figure 11:
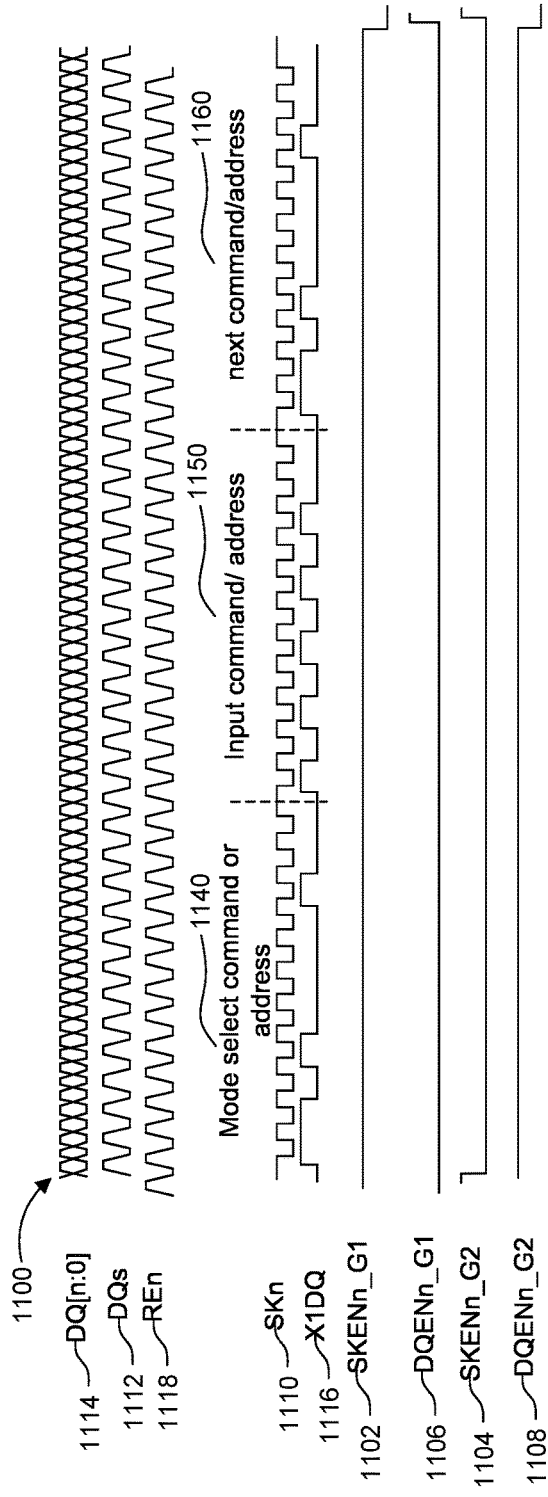
FIG. 11 schematically depicts an example timing diagram of signals for overlapping a DOUT operation with a command/address sequencing, in accordance with embodiments of the disclosed technology.

FIGS. 10 and 11 schematically depict an example timing diagrams of signals for overlapping a DIN/DOUT operations with command/address sequencing, in accordance with embodiments of the disclosed technology. FIG. 10 illustrates example timing diagram 1000 for overlapping a DIN operation with command/address sequencing. FIG. 11 illustrates example timing diagram 1100 for overlapping a DOUT operation with command/address sequencing.

Timing diagram 1000 and 1100 depict example operation performed on memory system 900 based on one or more signals exchanged between storage controller 930 and memory array 902 (also referred to as a first group of memory dies including memory die 910) via memory interface 919 one or more signal exchanged between memory array 904 (also referred to as a second group of memory dies including memory die 920) via a memory interface 929. The timing diagrams 1000 and 1100 illustrate examples of overlapping multi-die data operations, whereby memory array 902 executes a DIN/DOUT operation that is overlapped, in time, with command/address sequencing on memory array 904. Reference herein will be made with respect to a single memory die on each memory array (e.g., memory dies 910 and 920).

The command/address sequence depicted in FIGS. 10 and 11 utilize various signals that are also used in connection with the existing command/address sequences depicted in FIGS. 7-8B, but employs them in a novel way that allows for the command/address sequence to be performed without requiring use of an I/O data bus (e.g., data bus 228 of memory interface 224) and/or the DQ[n:0] signals. For example, the command/address sequence encodes bit information on the X1DQ signal of the test interface (e.g., test interface 684), where the bit information can be decoded to obtain a control signals (e.g., CLE signal, ALE signal, etc.), command codes, and address codes, and thus, does not require the DQ[n:0] signals or I/O data bus to provide the command and address information, nor enable the functionality. In contrast, the command/address sequence of FIGS. 10 and 11 utilize the X1DQ signal over the test data bus to both enable command/address sequencing and provide the command and address information. As such, the command/address sequence of FIGS. 10 and 11 can be performed in parallel with DIN/DOUT operations, thereby eliminating the bottleneck that the command/address sequence would otherwise have caused, and providing a technical improvement over the existing command/address sequences of FIGS. 8A and 8B, in the form of improved memory system performance.

Referring first to FIG. 10, timing diagram 1000 includes a plurality of signals for performing DIN overlapped with command/address sequencing. For example, but not limited to, timing diagram 1000 includes an active-low command/address enable (SKEn_G1) signal 1002 the first group of memory dies, an active-low command/address enable (SKEn_G2) signal 1004 for the second group of memory dies, an active-low DIN/DOUT enable (DQENn_G1) signal 1006 for the first group, an active-low DIN/DOUT enable (DQENn_G1) signal 1008 for the second group, a command/address clock signal (SKn) signal 1010, a data strobe (DQS) signal 1012, I/O data (DQ [n:0]) signals 1014, and a 1-bit I/O data (X1DQ) signal 1016.

In the illustrative example of FIG. 10, the storage controller asserts the SKENn_G1 signal 1002 to logic HIGH level, to notify the memory die 910 that command/address sequencing is disabled. The storage controller also asserts the DQENn_G1 signal to logic LOW level, thereby notifying the memory die 910 of incoming data over the DQ [n:0] signal 1014 for the DIN operation and enabling the DIN operation. The DQS signal 1012 is a clock signal for sampling the DQ [n:0] signal in the memory die 910 at each rising or falling edge of the DQS signal 1012. Accordingly, a signal DQ [n:0] is received in the memory die 910 when the DQS signal 1012 is toggled. The memory die 910 detects the DQ[n:0] signals and, for each rising or falling edge of the DQS signal 1012, latches bit values encoded into the DQ[n:0] signals to obtain a DIN bit pattern. The memory die 910 then decodes the DIN bit pattern to obtain DIN and stores DIN in a data register (e.g., data register 678).

Concurrent with memory die 910 executing the DIN operation, the storage controller asserts SKENn_G2 signal 1004 to logic LOW level, to notify the memory die 920 that command/address sequencing is enabled. The storage controller also asserts the DQENn_G2 signal to logic HIGH level, thereby notifying the memory die 920 that data operations on the DQ [n:0] signal are disabled. The storage controller transmits command and address data for sequencing over the X1DQ signal 1016, for example, as set forth in connection with FIGS. 7 and 9.

In the illustrative example shown in FIG. 10, during a mode select protocol portion 1040, the storage controller generates a mode select signal encoded with a first bit pattern to instruct the memory die 910 to enter a one of CLE or ALE mode. For example, a first bit pattern may assert a bit corresponding to the CLE or ALE mode as logic HIGH level, while asserting the other bits as logic LOW level, to select CLE or ALE. In the illustrative example of FIG. 10, the first and second bits are at logic HIGH level indicating mode selection protocol is initiated, which is followed by a first bit set to logic LOW level (e.g., a CEn bit set to 0) and a second bit set to logic HIGH level (e.g., a CLE bit set to 1), the rest of the bits are set to logic low in this example. Thus, the first bit pattern indicates CLE is selected. Alternatively, if the second bit was set to logic LOW level and the third bit was set to logic HIGH level (e.g., a ALE bit set to 1), the first bit pattern was indicate ALE is selected. The mode select signal is transmitted from the storage controller 930 to the memory die 910 on the X1DQ signal 1016 via the test data bus of the test interface (e.g., test interface 684). The memory die 910 detects the X1DQ signal 1016 and, at each rising or falling edge of the SKn signal 1010, samples and latches a bit value in the mode select signal to obtain the first bit pattern. The memory die 910 decodes the first bit pattern to identify the selected mode as one of CLE or ALE.

During the input protocol portion 1050, following a first bit at logic HIGH level and a second bit at logic LOW level indicating data of the selected mode is forthcoming, the storage controller 930 generates a command or address data signal encoded with a second bit pattern that is one of a command code and an address code. In the case of a command code as indicated by mode select protocol portion 1040 in this example, the storage controller 930 may encode bits D0-D7 of the data signal with a command code, such as, any one of 00000000 for command code 00 h, 00110000 for command code 30 h, 10101010 for command code 55 h, etc. In the case of an address code, the storage controller 930 may encode first bit pattern as bits D0-D7 as, for example, 00100000, which may be decoded to an address code to select a wordline 1 of string 0. The command or address signal is transmitted from the storage controller 930 to the memory die 920 via the test data bus of the test interface. The memory die 920 detects the X1DQ signal 1016 and, at each rising or falling edge of the SKn signal 1010, samples and latches a bit value in the command or address data signal to obtain the second bit pattern. The memory die 920 decodes the second bit pattern to retrieve the one of the command code and address code. The command code or address code is then processed as set forth above in connection with FIG. 6, for example, by storing the command code in the command register 670 or address register 668, respectively.

Once the input protocol portion 1050, a subsequent mode select protocol portion 1060 can be performed, for example, by setting two consecutive bits to logic HIGH level. For example, in a case where mode select protocol portion 1040 includes a CLE command and a command code is transmitted to the memory die 910 over the X1DQ signal 1016 (e.g., the X1DQ signal 1016 includes a CLE signal), the storage controller 930 generates a second mode select signal encoded with a third bit pattern to instruct the memory die 910 to enter an ALE mode (e.g., the X1DQ signal 1016 includes an ALE signal). The memory die 910 detects the X1DQ signal 1016 and, at each rising or falling edge of the SKn signal 1010, samples and latches a bit value in the mode select signal to obtain the third bit pattern. The memory die 910 decodes the third bit pattern to identify the selected mode ALE.

After the portion 1060, for example during a subsequent input protocol portion (not shown), the storage controller 930 generates an address data signal encoded with a fourth bit pattern that is an address code. The address data signal is transmitted from the storage controller 930 to the memory die 920 via the test data bus of the test interface. The memory die 920 detects the X1DQ signal 1016 and, at each rising or falling edge of the SKn signal 1010, samples and latches a bit value in the command or address data signal to obtain the fourth bit pattern. The memory die 920 decodes the fourth bit pattern to retrieve the address code.

Turning now to FIG. 11, timing diagram 1100 includes a plurality of signals for performing DOUT overlapped with command/address sequencing. For example, similar to timing diagram 1000, the plurality of signals includes, but is not limited to, timing diagram 1100 includes an active-low command/address enable (SKEn_G1) signal 1102 the first group of memory dies, an active-low command/address enable (SKEn_G2) signal 1104 for the second group of memory dies, an active-low DIN/DOUT enable (DQENn_G1) signal 1106 for the first group, an active-low DIN/DOUT enable (DQENn_G1) signal 1108 for the second group, a command/address signal (SKn) signal 1110, a data strobe (DQS) signal 1112, IO data (DQ [n:0]) signals 1114, and a 1-bit I/O data (X1DQ) signal 1116. The timing diagram 1100 also includes an active-low read enable (REn) signal 1118.

In the illustrative example of FIG. 11, the storage controller asserts the SKENn_G1 signal 1102 to logic HIGH level, to notify the memory die 910 that command/address sequencing is disabled. The storage controller also asserts the DQENn_G1 signal to logic LOW level, thereby enabling transmission of data over the DQ [n:0] signal 1114 for the DOUT operation. After the waiting period waiting period $t_{WHR1}$ elapses (as described above in connection with FIG. 8), the storage controller 930 transmits the REn signal 1118 and the memory die 910 starts reading out data from the data register and, after waiting period $t_{WHR2}$ elapses, starts transmitting DOUT on the DQ [n:0] signal 1114 to the storage controller 930 clocked according to the DQS signal 1112.

Concurrent with the memory die 910 executing the DOUT operation, the storage controller asserts SKENn_G2 signal 1104 to logic LOW level, to notify the memory die 920 that command/address sequencing is enabled. The storage controller also asserts the DQENn_G2 signal to logic HIGH level, thereby notifying the memory die 920 that data operations on the DQ [n:0] signal 1114 are disabled. The storage controller transmits command and address data for sequencing over the X1DQ signal 1116, for example, as set forth in connection with FIGS. 7 and 9.

In the illustrative example shown in FIG. 11, during a mode select protocol portion 1140, the storage controller generates a mode select signal encoded with a first bit pattern to instruct the memory die 910 to enter a one of CLE or ALE mode, for example, as described above in connection with mode select protocol portion 1040. The mode select signal is transmitted from the storage controller 930 to the memory die 910 on the X1DQ signal 1116 via the test data bus of the test interface (e.g., test interface 684). The memory die 910 detects the X1DQ signal 1116 and obtains the first bit pattern. The memory die 910 decodes the first bit pattern to identify the selected mode as one of CLE or ALE.

During the input protocol portion 1150, the storage controller 930 generates a command or address data signal encoded with a second bit pattern that is one of a command code and an address code, for example, as described above in connection with input/output protocol portion 1050. The command or address data signal is transmitted from the storage controller 930 to the memory die 920 via the test data bus of the test interface. The memory die 920 detects the X1DQ signal 1116 and obtains the second bit pattern. The memory die 920 decodes the second bit pattern to retrieve the one of the command code and address code. The command code or address code is then processed as set forth above in connection with FIG. 6, for example, by storing the command code in the command register 670 or address register 668, respectively.

Once the input protocol portion 1150, a subsequent mode select protocol portion 1160 can be performed, for example, as described above in connection with mode select protocol portion 1060.

Figure 12:
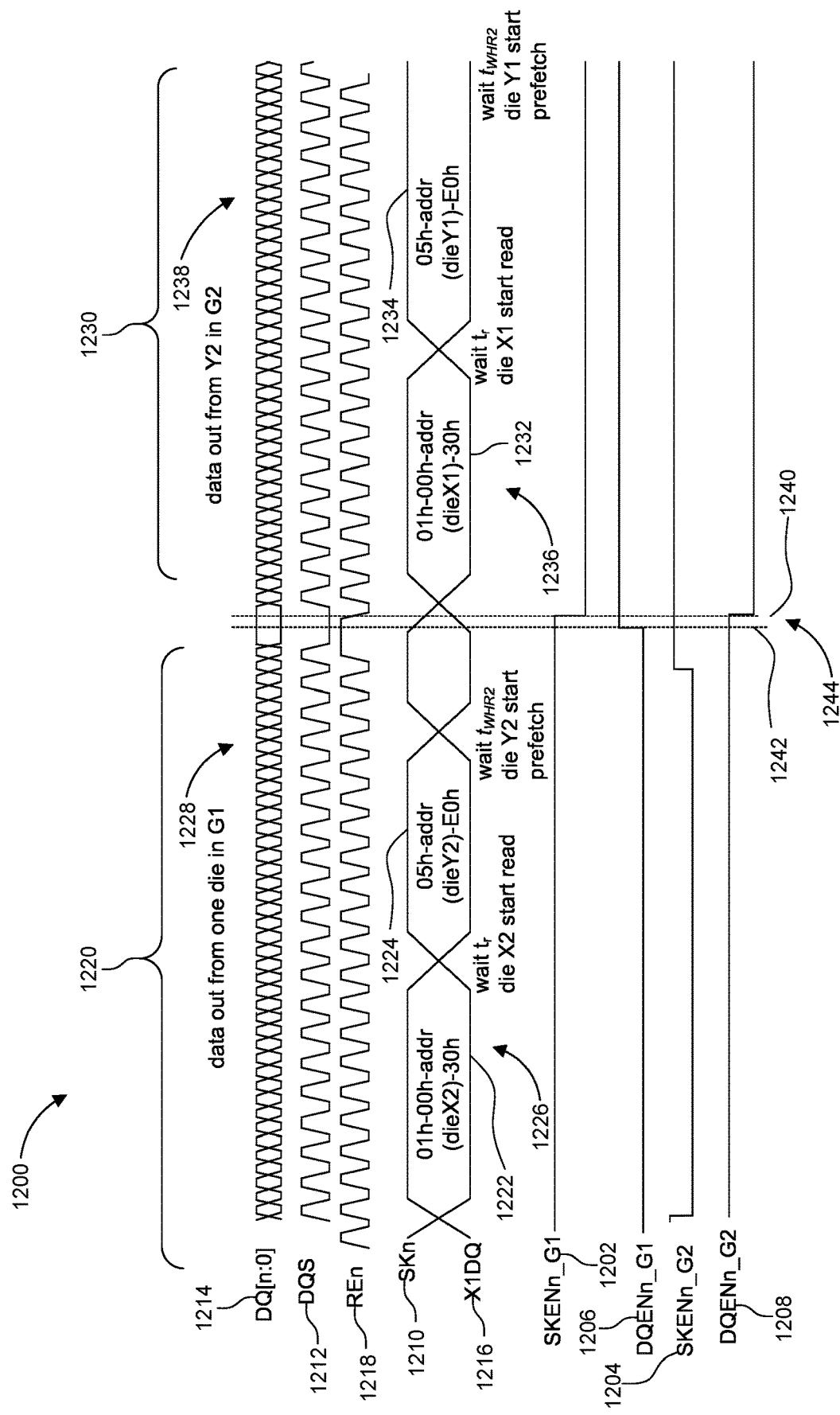
FIG. 12 schematically depicts an example timing diagram 1200 of signals illustrating how command/address sequencing overhead is hidden in the background, in accordance with embodiments of the disclosed technology.

FIG. 12 schematically depicts an example timing diagram 1200 of signals illustrating how command/address sequencing overhead is hidden in the background, in accordance with embodiments of the disclosed technology. Timing diagram 1200 depicts an example multi-die read operation performed on memory system 900 based on one or more signals exchanged between storage controller 930 and memory array 902 (also referred to as a first group of memory dies including memory die 910) via memory interface 919 one or more signal exchanged between memory array 904 (also referred to as a second group of memory dies including memory die 920) via a memory interface 929. The timing diagram 900 illustrates an example of multi-die data operations, whereby DOUT operations are overlapped with command/address sequencing. As such, the command/address sequencing is performed in the background, and the processing time overhead associated therewith is essentially hidden from data operations (e.g., DIN and DOUT operations). Thus, data operations can be performed in parallel with command/address sequencing, which improves overall data processing time due to parallelizing the processes.

FIG. 12 illustrates a series command/address sequence are depicted encoded in a data signal on X1DQ signal 1216, a first command/address sequence 1226 in a first time portion 1220 and a second 1236 in second time portion 1230. In addition, a series of DIN/DOUT operations are depicted encoded in data signal on DQ[n:0] signal 1214, a first DIN/DOUT operation 1228 in first time portion 1220 and a second 1238 in time portion 1230. Each command/address sequence may be performed in parallel with a DIN/DOUT operation. More specifically, in example embodiments of the disclosed technology, while a DIN/DOUT operation corresponding to a current read/write operation is being performed by a first memory die 910 on the I/O bus via DQ[n:0] single 1214, a command/address sequence corresponding to a read/write operation may be performed in parallel by a second memory die 920 on the test data bus via X1DQ signal 1216. The command/address sequence may correspond to a read/write operation that will be performed after the DIN/DOUT operation 1228, for example, during the second time portion 1230.

Timing diagram 1200 includes a first time portion 1220 and a second time portion 1230. In the first time portion 1220, one memory die in a first group (G1) of memory dies (e.g., memory die 910 of memory array 902) executes a DIN/DOUT operation 1228 (e.g., DOUT operation in this example) that is overlapped, in time, with command/address sequencing 1226 performed on a second group (G2) of memory dies (e.g., memory array 904). In this example, the first group G1 of memory dies may include at least memory die X1 and memory die Y1 and the second group G2 of memory dies may include at least memory die X2 and memory die Y2. The example command/address sequencing 1226 includes different operations for different dies (e.g., operation 1222 for memory die X2 and operation 1224 for memory die Y2); however, operations may be for the same die. In the second time portion 1230, a memory die (Y2) of a second group (e.g., memory die 920) executes a DIN/DOUT operation 1238 (e.g., a DOUT operation in this example) that is overlapped, in time, with command/address sequencing 1236 performed on the memory die of the first group (e.g., memory die 910). The example command/address sequencing 1236 includes different operations for different dies (e.g., operation 1232 for memory die X1 and operation 1234 for memory die Y1); however, operations may be for the same die.

Accordingly, the command/address sequence 1226 may be performed in parallel with the DIN/DOUT operation 1228. The DIN/DOUT operation 1228 may correspond to a prior command/address sequence that was performed by memory die 910. More specifically, the prior command/address sequence and the current DIN/DOUT operation 1226 may both correspond to a same current read/write operation. The command/address sequence 1224, on the other hand, may be associated with a next read/write operation to be performed by the memory die Y2, but may be performed in parallel with the DIN/DOUT operation 1228 associated with the current read/write operation on the memory die 910. The command/address sequence depicted in FIGS. 10 and 11 according to example embodiments of the disclosed technology enables the parallelism depicted in FIG. 12 between the command/address sequencing and the DIN/DOUT operations.

Timing diagram 1200 includes a plurality of signals for performing DOUT operations overlapped with command/address sequencing. For example, timing diagram 1200 includes an active-low command/address enable (SKEn_G1) signal 1202 the first group G1 of memory dies, an active-low command/address enable (SKEn_G2) signal 1204 for the second group G2 of memory dies, an active-low DIN/DOUT enable (DQENn_G1) signal 1206 for the first group G1, an active-low DIN/DOUT enable (DQENn_G1) signal 1208 for the second group G2, a command/address clock signal (SKn) 1210, a data strobe (DQS) signal 1212, IO data (DQ [n:0]) signals 1214, a IO data (X1DQ) signal 1216, and an active-low read enable (REn) signal 1218.

In operation, during time portion 1220, the storage controller asserts the SKENn_G1 signal 1202 to logic HIGH level, to notify the memory die 910 that command/address sequencing is disabled. The storage controller also asserts the DQENn_G1 signal to logic LOW level, thereby enabling transmission of data over the DQ [n:0] signal 1214 for the DOUT operation 1228. After the waiting period waiting period $t_{WHR1}$ elapses (as described above in connection with FIG. 8), the storage controller 930 transmits the REn signal 1218 and the memory die 910 starts reading out data from the data register and, after waiting period $t_{WHR2}$ elapses, starts transmitting DOUT on the DQ [n:0] signal 1214 to the storage controller 930 clocked according to the DQS signal 1212.

Concurrent with the DOUT operation 1228 performed by memory die 910, the storage controller asserts SKENn_G2 signal 1204 to logic LOW level, to notify the memory dies of the second group G2 that command/address sequencing is enabled. The storage controller also asserts the DQENn_G2 signal to logic HIGH level, thereby notifying the second group G2 that data operations on the DQ [n:0] signal 1214 are disabled. The storage controller transmits command and address data for sequencing over the X1DQ signal 1216, for example, as set forth in connection with FIGS. 7 and 9. For example, the memory die X2 performs a first read operation 1222 for cell read command and address sequencing based on an "ooh" to "30 h" commands (and column and address data) decoded from a first bit pattern encoded onto the X1DQ signal 1216 sampled based on SKn signal 1210. As explained above, the "ooh" command notifies the memory die X2 to execute the cell read command at the address provided, and the "30 h" command instructs the memory die X2 to store the data in data register.

After the period $t_R$ elapses, the memory die Y2 performs a second read operation 1224 for register read command and address sequencing based on an "05 h" to "E0 h" commands (and column and address data) decoded from a second bit pattern encoded onto the X1DQ signal 1216 sampled based on SKn signal 1210. As explained above, the "05 h" command notifies the memory die Y2 to execute the register read command at the address provided, and the "E0 h" command instructs the memory die Y2 to transmit the data to the storage controller.

Then, during the waiting period $t_{WHR2}$, the memory die Y2 starts prefetching processes and packages for the DOUT operation 1238. Also, during the waiting period $t_{WHR2}$, the storage controller toggles the SKENn_G2 to logic HIGH level to disable the command/address sequencing over the test interface and toggles DQENn_G2 to logic LOW level to instruct the memory die Y2 to perform DOUT on the DQ [n:0] signal 1214, for example, during time portion 1230. For example, after waiting period $t_{WHR2}$ elapses, the memory die Y2 starts transmitting DOUT on the DQ [n:0] signal 1214 to the storage controller 930 clocked according to the DQS signal 1212. As an illustrative example, the DQENn_G2 signal 1208 may be toggled to logic LOW level when the storage controller 930 is ready to receive data from the second group G2 of memory dies through DQ[n:0] signal 1214. The DQENn_G2 signal 1208 and the DQENn_G1 signal 1206 may use a common bus, for example, the bus from the first group G1 to the storage controller 930 may be common with the bus from the second group G2 and the storage controller 930. During time portion 1220 the storage controller 930 may be still busy receiving data from first group G1. When the data transfer from the first group G1 is done, then the first group G1 disables DQENn_G1 signal 1206 and the second group G2 enables DQENn_G2 signal 1208 to enable the data bus for DQ[n:0] signal 1214 from the second group G2. QENn_G2 signal 1208 and QENn_G1 signal 1206 can both be disabled, but cannot both be enabled at the same time otherwise contention may occur on the data bus. Similarly, for SKENn_G1 signal 1202 and SKENn_G2 signal 1204, both signals cannot be enabled at the same time.

Concurrent with the DOUT operation 1238 during time portion 1230, in the illustrative example, the first group G1 may be instructed to perform command/address sequencing 1236 on the test interface, for example, responsive to a command from a host device to perform another data operation. For example, in parallel with the DOUT operation 1238, the storage controller asserts SKENn_G1 signal 1204 to logic LOW level, to notify the first group G1 of memory dies that command/address sequencing is enabled. The storage controller also asserts the DQENn_G1 signal to logic HIGH level, thereby notifying the first group G1 of memory dies that data operations on the DQ [n:0] signal 1214 are disabled. The storage controller transmits command and address data for sequencing over the X1DQ signal 1216, for example, as set forth in connection with FIGS. 7 and 9. For example, the memory die X1 performs a first operation 1232 for cell read command and address sequencing based on an "ooh" to "30 h" commands (and column and address data) decoded from a third bit pattern encoded onto the X1DQ signal 1216 sampled based on SKn signal 1210. After the period $t_R$ elapses, the memory die Y1 performs a second operation 1234 for register read command and address sequencing based on an "05 h" to "E0 h" commands (and column and address data) decoded from a fourth bit pattern encoded onto the on the X1DQ signal 1216 sampled based on SKn signal 1210.

Then, during the waiting period $t_{WHR2}$, the memory die Y1 starts prefetching processes and packages a subsequent DIN/DOUT operation to be performed by the memory die Y1. Also, during the waiting period $t_{WHR2}$, the storage controller may toggle the SKENn_G1 to logic HIGH level to disable the command/address sequencing over the test interface and toggles DQENn_G1 to logic LOW level to instruct the memory die Y1 to perform DOUT on the DQ [n:0] signal 1214 (not shown). For example, after waiting period $t_{WHR2}$ elapses, the memory die Y1 starts transmitting DOUT on the DQ [n:0] signal 1214 to the storage controller 930 clocked according to the DQS signal 1212.

The amount of time to perform command/address sequencing for embodiments disclosed herein may be based on the number cycles required to execute the command/address sequencing over the test interface (e.g., in a 1-bit sequence on the X1DQ signal). The number of cycles refers to the period of the SKn signal used to sample the X1DQ signal. The current state of art of memory systems provides for an SKn signal having a cycle time or period of 10 ns, while some implementations use 50 ns cycle time. The cycle time of the SKn signal is continuing to improve to shorter periods. The embodiments herein are not limited to 10 ns or 50 ns, but use these cycle times as illustrative examples only. In the testing protocol described above in connection with FIG. 7, the number of cycles to complete each command is 22 cycles (e.g., 22 periods of the SKn signal 704 of FIG. 7). Similarly, an address requires 22 cycles to complete. Turning to the example operations of FIG. 12, the operation 1224 and 1234 each require 154 cycles to complete using the test interface protocol of FIG. 7, while the combined operation 1222 and 1224 and combined operation 1232 and 1234 each require 176 cycles. Table 2 below provides examples times for $t_{WC} \times 7 + t_{WHR2}$ based on the cycle times and number of cycles provided above.

TABLE 2

|  | # of cycles | Cycle time = 50 ns | Cycle time = 10 ns |
| --- | --- | --- | --- |
| Each command | 22 | 1100 ns | 220 ns |
| Each address | 22 | 1100 ns | 220 ns |
| 01 h-00 h-addr*5-30 h | 176 | 8800 ns | 1760 ns |
| 05 h-addr*5-E0 | 154 | 7700 ns | 1540 ns |

Thus, as shown above, the value for $t_{WC} \times 7 + t_{WHR2}$ according to the embodiments disclosed herein may be longer than example of 370 ns provided in connection with FIG. 8. This is because the command/address sequencing of FIGS. 8A and 8B was performed using an I/O data bus having 8-bit signals DQ [0:7] as eight data lines, whereas the embodiments herein utilize a test data bus having a 1-bit signal X1DQ as a single data line. Thus, while the total time for the command/address sequencing may be longer, the total time to complete a read/write operation is reduced due to performing the command/address sequencing in the background and in parallel with DIN/DOUT operations. For example, as illustrated above in connection with FIG. 12, the time needed for the command/address sequencing is performed in parallel with DIN/DOUT operations, thereby hiding the processing time overhead associated with command/address sequencing. As such, the execution of command/address sequencing on a 1-bit signal X1DQ in parallel with DIN/DOUT operations on 8-bit signals DQ [n:0] reduces overall processing time to complete host commands. Additionally, the SKn cycle time can be reduced to 2 ns, which will then closely follow original overhead of 370 ns as in the above example, along with being hidden due to parallel operation with DIN/DOUT operations. Thus, even more command/address sequencing is possible allowed within a smaller window of time and hidden within DIN/DOUT operations.

Accordingly embodiments herein provide a technical solution to a technical problem associated with existing command and address sequencing by performing command/address sequence in parallel with DIN/DOUT operations, thereby reducing (and even removing) performance bottleneck due to process time overhead for executing the command/address sequencing on the DQ lines. Thus, memory system data operation performance can be improved by reducing command/address overhead, which enables memory systems to be constrained more by DIN/DOUT speeds and less so by command/address sequencing.

FIG. 12 also illustrates a dotted lines 1240 and 1242. Dotted line 1240 corresponds with toggling DQENn_G2 signal 1208 to logic LOW level and dotted line 1242 corresponds with toggling DQENn_G1 signal 1206 to logic HIGH level. The timing gap 1244 between line 1242 and 1240 is a period of time from the one memory die in a first group of memory dies (e.g., memory die 910 of memory array 902) disabling the data bus between the one memory die and the storage controller to the one memory die of a second group of memory dies (e.g., memory die 920) enabling its data bus with the storage controller. In various embodiments, the timing gap 1244 may be needed to avoid contention at the storage controller over the data bus.

Figure 13A:
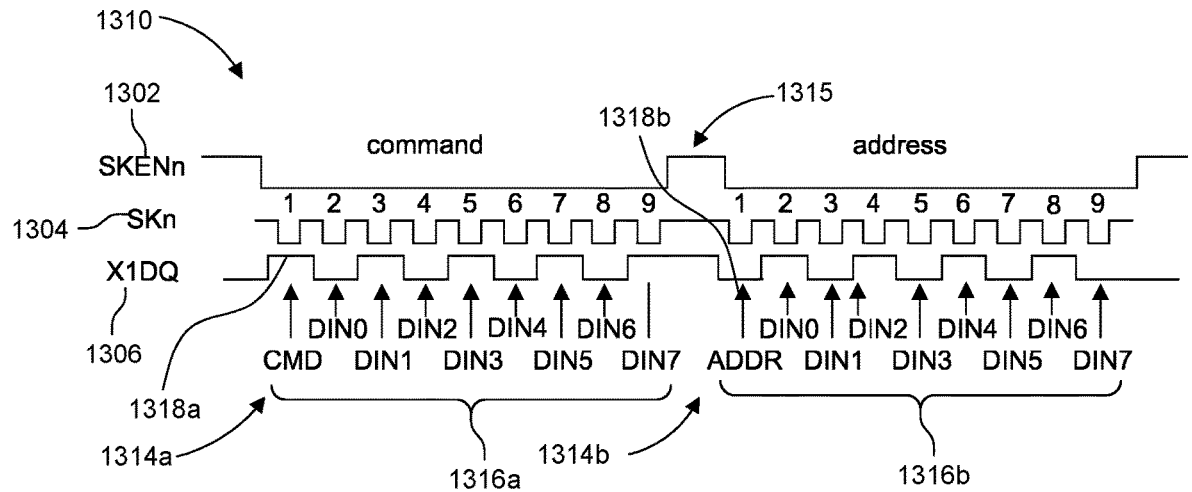
FIGS. 13A and 13B illustrate example timing diagrams for additional embodiments for command/address sequencing.
Figure 13B:
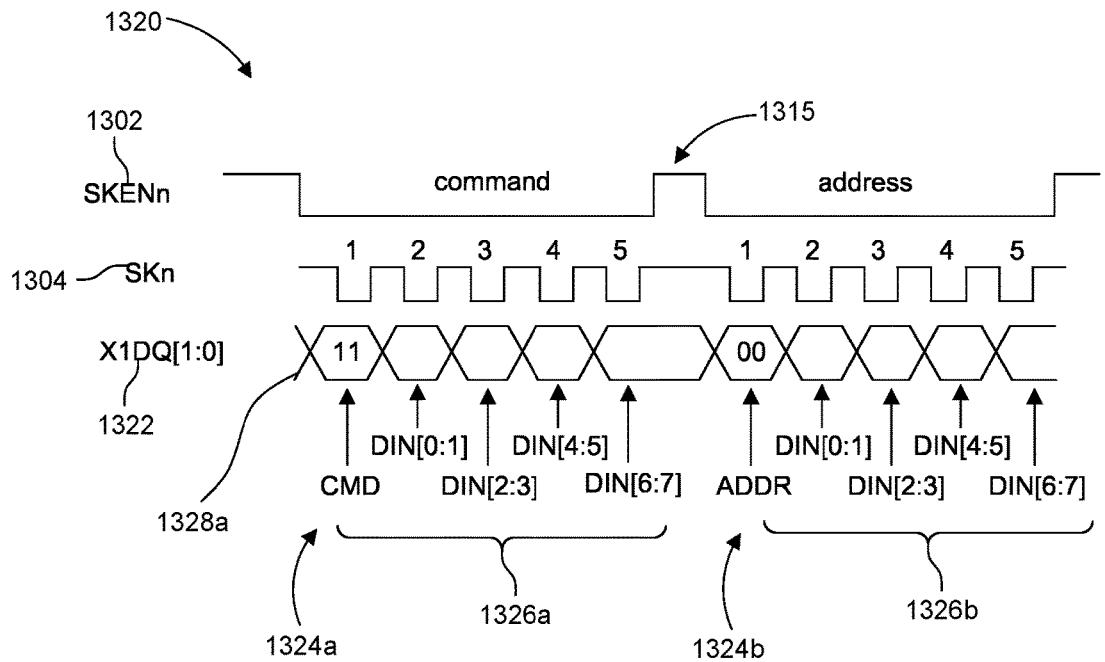

FIGS. 13A and 13B illustrate example timing diagrams for command/address sequencing, in accordance with embodiments of the disclosed technology. FIG. 13A illustrates a timing diagram 1310 and FIG. 13B illustrates timing diagram 1320, both of which provide alternative embodiments for command/address processing that provide increased command/address processing speeds. For example, as described above, the test interface protocol of FIG. 7 includes 22 cycles to complete a command or address sequencing. Timing diagrams 1310 and 1320 provide for a reduced number of cycles to complete each command or address.

For example, timing diagram 1310 is similar to timing diagram 710 in that timing diagram 1300 includes the SKn signal 1304 and the X1DQ signal 1306. Timing diagram 1310 also includes the SKENn signal 1302 as described above in connection with FIGS. 9-12. Thus, timing diagram 1310 is substantially the same as the preceding embodiments described in connection with FIGS. 9-12. However, while the preceding embodiments operated using the same protocol as the test interface, the timing diagram 1310 illustrates a command/address sequencing specific implementation that modifies the test interface protocol. For example, during the mode select protocol portion 1314 of the test interface protocol (e.g., portion 714 of FIG. 7) bits were set for certain modes and settings that may be unnecessary for command/address sequencing. Specifically, for example, the CEn bit, MVM bit, PARAMs bit, and WPn bit shown in FIG. 7 are not necessary and are unrelated to command and address sequencing. Thus, as shown in FIG. 13A, the mode selection protocol portion of FIG. 7 can be reduced to a single bit 1318 in the mode selection protocol portion 1314 of FIG. 13A, which is followed by the input/output protocol portion 1316.

For example, the storage controller may toggle the SKENn signal 1302 to logic LOW level to notify the memory die that command/address sequencing is enabled. The storage controller can then assert a first bit 1318*a* on the X1DQ signal 1306 to logic HIGH level in the mode select protocol portion 1318*a*, for example, to notify the memory die that the next bits are command bits. During the input/output protocol portion 1316*a*, the storage controller then transmits bits at logic HIGH or LOW levels for D0 to D7 according to a command for the memory die. Then the SKENn signal 1302 can be toggled at 1315 to logic HIGH level to rest the bit counter and toggled back to logic LOW level to notify the memory die that command/address sequencing is enabled. The storage controller can then assert a first bit 1318*b* on the X1DQ signal 1306 to logic LOW level in the mode select protocol portion 1314*b*, for example, to notify the memory die that the next bits are address bits. During the input/output protocol portion 1316*b*, the storage controller then transmits bits at logic HIGH or LOW levels for D0 to D7 according to a command for the memory die. While logic HIGH and LOW levels for command and address, respectively, are described above, this setting is purely for illustrative purpose. For example, the command may be indicated by logic LOW level and the address by logic HIGH level.

Using the protocol shown in FIG. 13A, the number of cycles for each command and address can be reduced to 9 cycles, compared to 22 cycles of the test interface protocol. Thus, the processing time overhead of the command/address sequencing is reduced according. For example, where cycle time is 10 ns, the $t_{WC} \times 7 + t_{WHR2}$ of a command according to timing diagram 1210 is 90 ns as compared to 220 ns of Table 2.

Timing diagram 1320 provides even further reduction in processing time overhead of the command/address sequencing according to embodiments herein. For example, a data line may be added to the interface thereby providing 2-bit signals X2DQ[0:1] 1322. Thus, for each sampling of the X2DQ signal 1322, two states may be indicated thereby reducing the number of cycles required to complete a command or process. For example, in the mode select protocol portion 1324a, the SKENn signal 1302 is toggled to logic LOW level and a first bit 1328a is asserted on the X2DQ signal 1322, to notify the memory die that the next bits are command bits. In this example, a command can be asserted by setting both bits to logic HIGH level (e.g., "11"); however, the command may be asserted by setting both bits to logic LOW level (e.g., "00"). Then in the input/output protocol portion 1326a, the storage controller then transmits bits at logic HIGH or LOW levels for D0 to D7 according to a command for the memory die. Then the SKENn signal 1302 can be toggled at 1315 to logic HIGH level to rest the bit counter and toggled back to logic LOW level to notify the memory die that command/address sequencing is enabled. In the mode select protocol portion 1324b, the storage controller asserts an address by setting the first two bits 1328b on the X2DQ signal 1306 to logic LOW level, for example. While both bits are set to logic LOW level to assert an address in this example, an address may be asserted by setting both bits to logic HIGH level. In the input/output protocol portion 1326b, the storage controller then transmits bits at logic HIGH or LOW levels for D0 to D7 according to a command for the memory die.

Using the protocol shown in FIG. 13B, the number of cycles for each command and address can be reduced to 5 cycles, compared to 22 cycles of the test interface protocol. Thus, the processing time overhead of the command/address sequencing is reduced according. For example, where cycle time is 10 ns, the $t_{WC} \times 7 + t_{WHR2}$ of a command according to timing diagram 1200 is 40 ns as compared to 220 ns of Table 2.

In another example, more than two data lines may be used. For example, the command/address sequencing may be performed on a data bus having m data lines (also referred to herein as a m-bit signal data bus), where m is an integer that is less than a number n of data lines in data bus used for the DQ[n:0] signal (e.g., data bus 228)

Figure 14:
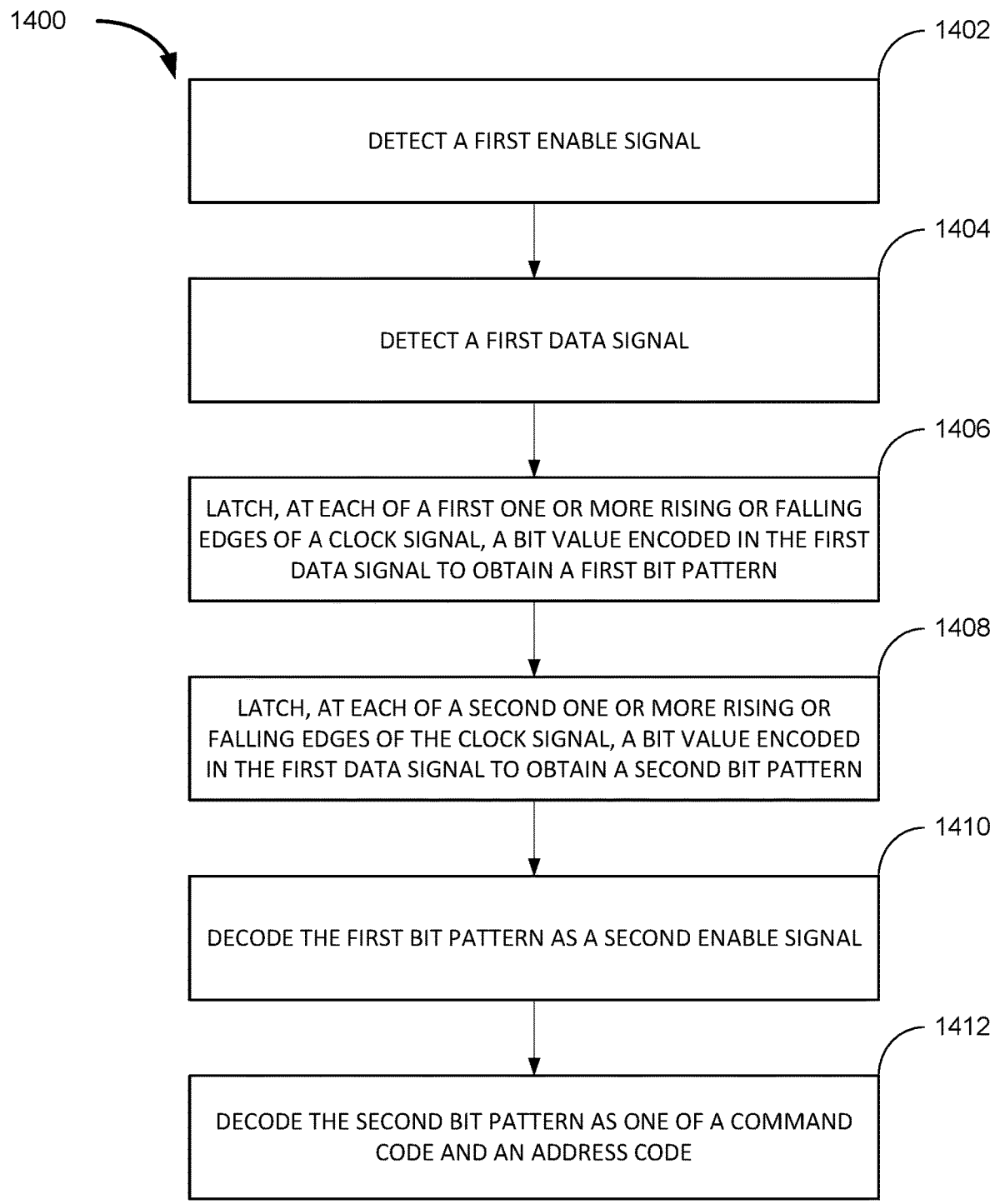
FIG. 14 is a flowchart of an illustrative method for performing a command/address sequence according to example embodiments of the disclosed technology.
Figure 15:
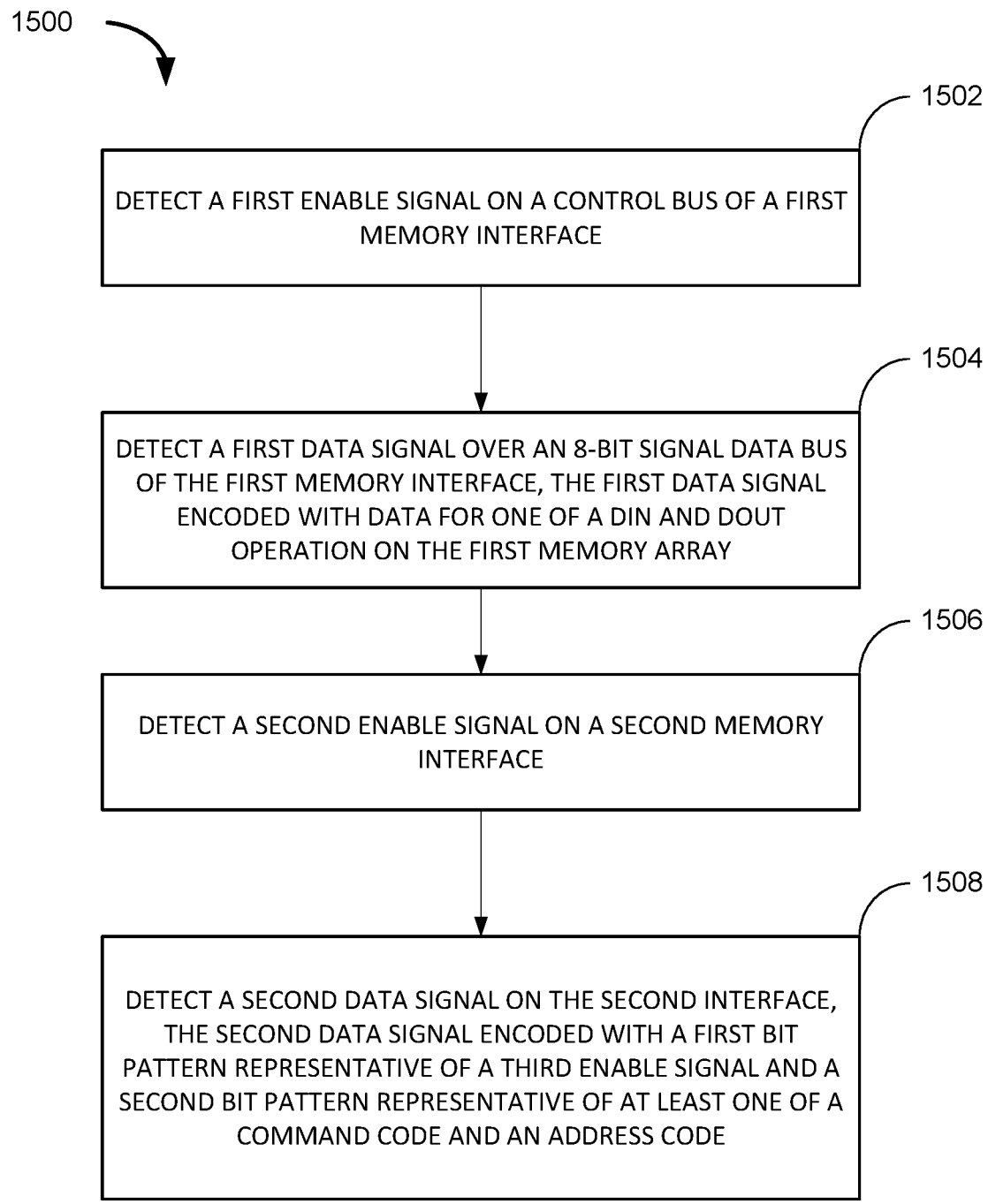
FIG. 15 is a flowchart of another illustrative method for performing a command/address sequence according to example embodiments of the disclosed technology.

FIGS. 14 and 15 are flowcharts of illustrative methods 1400 and 1500 for performing a command/address sequence according to example embodiments of the disclosed technology. The method 1400 and/or the method 1500 may be performed by a controller such as storage controller 102 (FIG. 1) and/or storage controller 930 (FIG. 9). More generally, the methods 1400 and/or 1500 may be performed by any volatile or non-volatile memory system configured to interface with a memory device such as a NAND device (or that is embedded therein) including, without limitation, a separately provided DRAM, an embedded microcontroller, or the like. In some embodiments, the instructions for performing the method 1400 and/or the instructions for performing the method 1500 may be hardwired or fused into the memory core.

Referring now to FIG. 14, at block 1402, a first enable signal is detected. In example embodiments, the first enable signal may be a SKENn signal to instruct a memory die (e.g., memory die 104a of FIG. 1 and/or memory die 910 or 920 of FIG. 9) to activate the test interface for command/address sequencing. The memory die may detect the SKENn signal from the storage controller and enable command/address sequencing via the test interface.

At block 1404, a first data signal is detected, for example, by the memory die. In example embodiments, the first data signal is detected on a test data bus of the test interface. The test data bus may comprise a 1-bit I/O data signal via a single data line (e.g., as described in connection with FIGS. 9-12).

In another example, the test data bus has an m-bit I/O data signal, where m is an integer less than the number of bit I/O data signals used for DIN/DOUT operations (e.g., as described in connection with FIG. 13B). The storage controller may encode a first bit pattern. In example embodiments, the storage controller generates the first data signal by encoding a CLE or an ALE signal into an X1DQ signal on the test data bus.

At block 1406, responsive to detecting the first enable signal at block 1402, a bit value encoded in the first data signal to obtain a first bit pattern is latched at each of a first one or more rising or falling edges of a clock signal. For example, the clock signal may be the SKn signal generated by the storage controller and provided via the test data bus to the memory die for sampling the first data signal. At block 1408, a bit value encoded in the first data signal to obtain a second bit pattern is latched at each of a second one or more rising or falling edges of the clock signal. In example embodiments, the first bit pattern is encoded in the first data signal as bits the precede the second bit pattern. For example, the first bit pattern may correspond to a mode select protocol portion (e.g., portions 1040, 1060, 1140, 1160, 1314, and 1324) and the second bit pattern may correspond an input/output protocol portion (e.g., portions 1050, 1150, 1316, and 1326).

At block 1408, a second enable signal is decoded from the first bit pattern. In example embodiments, the memory die decodes the first bit pattern as one of a CLE command and an ALE command. At block 1410, one of a command code and an address code is decoded from the second bit pattern.

Referring now to FIG. 15, at block 1502, a first enable signal is detected on a control bus of a first memory interface. In example embodiments, the first memory interface may be memory interface 224 of FIGS. 2A and 2B and/or memory interface 919 or 929 of FIG. 9. The first memory interface may be between a first memory array and a storage controller and comprises an 8-bit signal data bus and the control bus. The first enable signal may be, for example, an SKENn signal and/or a DQENn signal as described above in connection with FIGS. 9-12. At block 1504, responsive to the first enable signal detected at block 1502, a first data signal is detected over the 8-bit signal data bus. The first data signal is encoded with data for one of a data in (DIN) and data out (DOUT) operation on the first memory array.

At block 1506, a second enable signal is detected a second memory interface. In example embodiments, the second memory interface may be memory interface 224 of FIGS. 2A and 2B and/or memory interface 919 or 929 of FIG. 9, and more specifically, a test interface thereof (e.g., as described in FIGS. 7 and 9). The second memory interface connects a second memory array and the storage controller. In an example embodiment, the second memory interface comprises at least one 1-bit signal data bus. In another example, the second memory interface comprises m-bit signal data bus, where m is an integer less than eight. In example embodiments, the second enable signal may be a SKENn signal that triggers command/address sequencing on the second memory interface.

Responsive to detecting the second enable signal at block 1506, at block 1508 a second data signal is detected on the second memory interface. The second data signal is encoded with a first bit pattern representative of a third enable signal and a second bit pattern representative of at least one of a command code and an address code. In example embodiments, the third enable signal may be one of a CLE and an ALE.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of performing a command/address sequence associated with a read/write operation for a memory device, the method comprising:
    detecting a first enable signal;
    detecting a first data signal;
    responsive to detecting the first enable signal, latching, at each of a first one or more rising or falling edges of a clock signal, a bit value encoded in the first data signal to obtain a first bit pattern;
    latching, at each of a second one or more rising or falling edges of the clock signal, a bit value encoded in the first data signal to obtain a second bit pattern;
    decoding the first bit pattern as a second enable signal; and
    decoding the second bit pattern as one of a command code and an address code.

2. The method of claim 1, wherein the command/address sequence is performed in parallel with a data in (DIN) or data out (DOUT) operation.

3. The method of claim 2, further comprising:
    receiving the first data signal on a first data bus; and
    receiving a second data signal for the DIN or DOUT operation on a second data bus.

4. The method of claim 3, wherein the second data bus is an n-bit signal data bus and the first data bus is an m-bit signal data bus, wherein n and m are integers and m is less than n.

5. The method of claim 1, wherein the first data signal is a 1-bit data signal.

6. The method of claim 1, wherein the second enable signal is a command latch enable signal, and the second bit pattern is a command code.

7. The method of claim 1, wherein the second enable signal is an address latch enable signal, and the second bit pattern is an address code.

8. The method of claim 1, further comprising:
    latching, at each of a third one or more rising or falling edges of a clock signal, a bit value encoded in the first data signal to obtain a third bit pattern;
    latching, at each of a fourth one or more rising or falling edges of the clock signal, a bit value encoded in the first data signal to obtain a fourth bit pattern;
    decoding the third bit pattern as third enable signal; and
    decoding the fourth bit pattern as one of a command code and an address code.

9. A memory device, comprising:
    one or more signal generators configured to generate a first enable signal, a second enable signal, and a clock signal; and
    a controller configured to:
        detect a first enable signal;
        detect a first data signal;
        responsive to detecting the first enable signal, latch, at each of a first one or more rising or falling edges of a clock signal, a bit value encoded in the first data signal to obtain a first bit pattern;
        latch, at each of a second one or more rising or falling edges of the clock signal, a bit value encoded in the first data signal to obtain a second bit pattern;
        decode the first bit pattern as a second enable signal; and
        decode the second bit pattern as one of a command code and an address code.

10. The memory device of claim 9, wherein the command/address sequence is performed in parallel with a data in (DIN) or data out (DOUT) operation.

11. The memory device of claim 10, further comprising:
    receiving the first data signal on a first data bus; and
    receiving a second data signal for the DIN or DOUT operation on a second data bus, distinct.

12. The memory device of claim 11, wherein the second data bus is an n-bit signal data bus and the first data bus is an m-bit signal data bus, wherein n and m are integers and m is less than n.

13. The memory device of claim 9, wherein the first data signal is a 1-bit data signal.

14. The memory device of claim 9, wherein the second enable signal is a command latch enable signal, and the second bit pattern is a command code.

15. The memory device of claim 9, wherein the second enable signal is an address latch enable signal, and the second bit pattern is an address code.

16. The memory device of claim 9, further comprising:
    latching, at each of a third one or more rising or falling edges of a clock signal, a bit value encoded in the first data signal to obtain a third bit pattern;
    latching, at each of a fourth one or more rising or falling edges of the clock signal, a bit value encoded in the first data signal to obtain a fourth bit pattern;
    decoding the third bit pattern as third enable signal; and
    decoding the fourth bit pattern as one of a command code and an address code.

17. A system, the system comprising:
a first memory array;
a second memory array;
a controller;
a first memory interface between the first memory array and the controller, the first memory array comprising an 8-bit signal data bus and a control bus, the first memory interface configured to:
  detect a first enable signal on the control bus; and
  responsive to the first enable signal, detect a first data signal over the 8-bit signal data bus, wherein the first data signal is encoded with data for one of a data in (DIN) and data out (DOUT) operation on the first memory array; and
a second memory interface between the second memory array and the controller, the second memory interface comprising at least one 1-bit signal data bus, the second memory interface configured to, in parallel with the first memory interface:
  detect a second enable signal on the 1-bit signal data bus; and
  responsive to the second enable signal, detect a second data signal on the 1-bit signal data bus, wherein the second data signal is encoded with a first bit pattern representative of a third enable signal and a second bit pattern representative of at least one of a command code and an address code.

18. The system of claim 17, wherein the first bit pattern is encoded in the second data signal prior to the second bit pattern.

19. The system of claim 17, wherein the third enable signal is a command enable signal and the first bit pattern is a command code.

20. The system of claim 19, wherein the second data signal is further encoded with:
  a third bit pattern representative of an address enable signal; and
  a fourth bit pattern representative of an address code.

* * * * *